US012787189B2

(12) United States Patent
Hwang et al.

(10) Patent No.: US 12,787,189 B2
(45) Date of Patent: Nov. 3, 2026

(54) DISPLAY DEVICE

(71) Applicant: LG ELECTRONICS INC., Seoul (KR)

(72) Inventors: Hyokune Hwang, Seoul (KR); Jeongrok Lee, Seoul (KR); Sangik Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 262 days.

(21) Appl. No.: 18/578,689

(22) PCT Filed: Jul. 5, 2022

(86) PCT No.: PCT/KR2022/009646
§ 371 (c)(1),
(2) Date: Jan. 11, 2024

(87) PCT Pub. No.: WO2023/287094
PCT Pub. Date: Jan. 19, 2023

(65) Prior Publication Data
US 2024/0324126 A1 Sep. 26, 2024

(30) Foreign Application Priority Data
Jul. 15, 2021 (KR) ........................ 10-2021-0092828

(51) Int. Cl.
*H05K 5/00* (2025.01)
*H05K 5/02* (2006.01)

(52) U.S. Cl.
CPC .................................. *H05K 5/0226* (2013.01)

(58) Field of Classification Search
None
See application file for complete search history.

(56) References Cited

U.S. PATENT DOCUMENTS 5,283,967 A * 2/1994 Abrams .................... G09F 1/12 40/773
6,502,792 B1 * 1/2003 Cho ...................... G06F 1/1601 248/922
(Continued)

FOREIGN PATENT DOCUMENTS

JP 07319402 12/1995
JP 10240154 9/1998
(Continued)

OTHER PUBLICATIONS

PCT International Application No. PCT/KR2022/009646, International Search Report dated Nov. 3, 2022, 2 pages.

*Primary Examiner* — Imani N Hayman
*Assistant Examiner* — Rashen E Morrison
(74) *Attorney, Agent, or Firm* — LEE, HONG, DEGERMAN, KANG & WAIMEY

(57) ABSTRACT

Disclosed is a display device. The display device of the present disclosure may include: a head including a display panel; a base positioned behind the head and having an opening formed in a front surface; and a hinge coupled to the head adjacent to one side of the head and including a hinge axis parallel to the one side of the head, wherein the head may be rotatable about the hinge axis, and wherein the base may include a partition wall dividing an internal space of the base into at least two spaces.

15 Claims, 35 Drawing Sheets

(56) References Cited

U.S. PATENT DOCUMENTS

| | | | | |
|---|---|---|---|---|
| 7,334,361 | B2 * | 2/2008 | Schrimpf | G09F 9/3026 16/370 |
| 7,698,785 | B2 * | 4/2010 | Bennett | E05D 3/16 16/369 |
| 7,866,621 | B1 * | 1/2011 | Walters | F16M 11/2014 248/421 |
| 8,104,204 | B1 * | 1/2012 | Syrstad | G09F 9/3026 40/544 |
| 10,146,271 | B1 * | 12/2018 | Pav | G06F 1/20 |
| 10,679,454 | B2 * | 6/2020 | Sato | G07F 9/023 |
| 2020/0312279 | A1 | 10/2020 | Sage et al. | |
| 2022/0205582 | A1 * | 6/2022 | Jeon | F16M 13/02 |
| 2022/0205588 | A1 * | 6/2022 | Jeon | F16M 11/041 |
| 2024/0280212 | A1 * | 8/2024 | Kim | F16M 11/126 |

FOREIGN PATENT DOCUMENTS

| | | |
|---|---|---|
| JP | 4302737 | 7/2009 |
| KR | 1020190036989 | 4/2019 |

* cited by examiner

[FIG. 1]
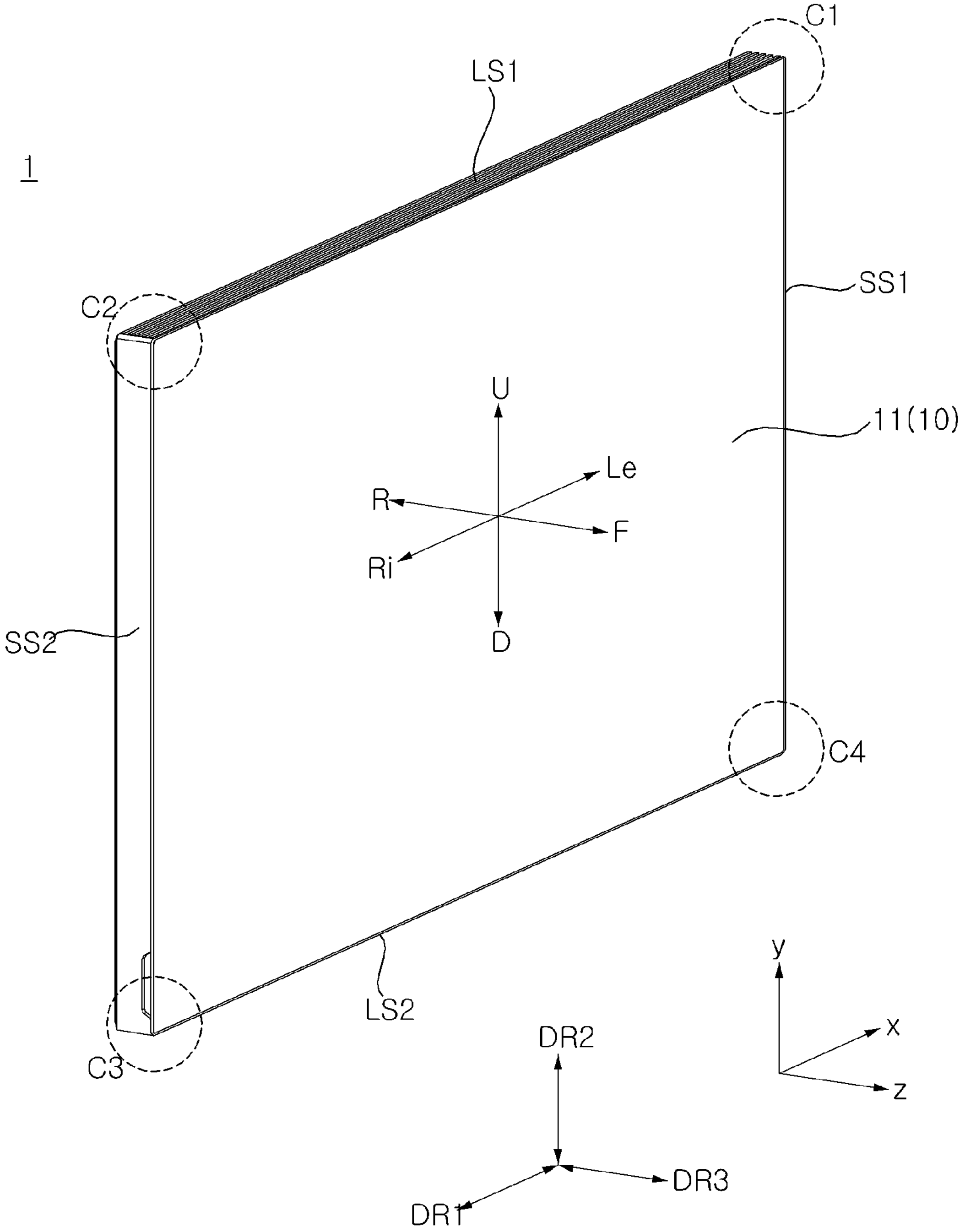

[FIG. 2]
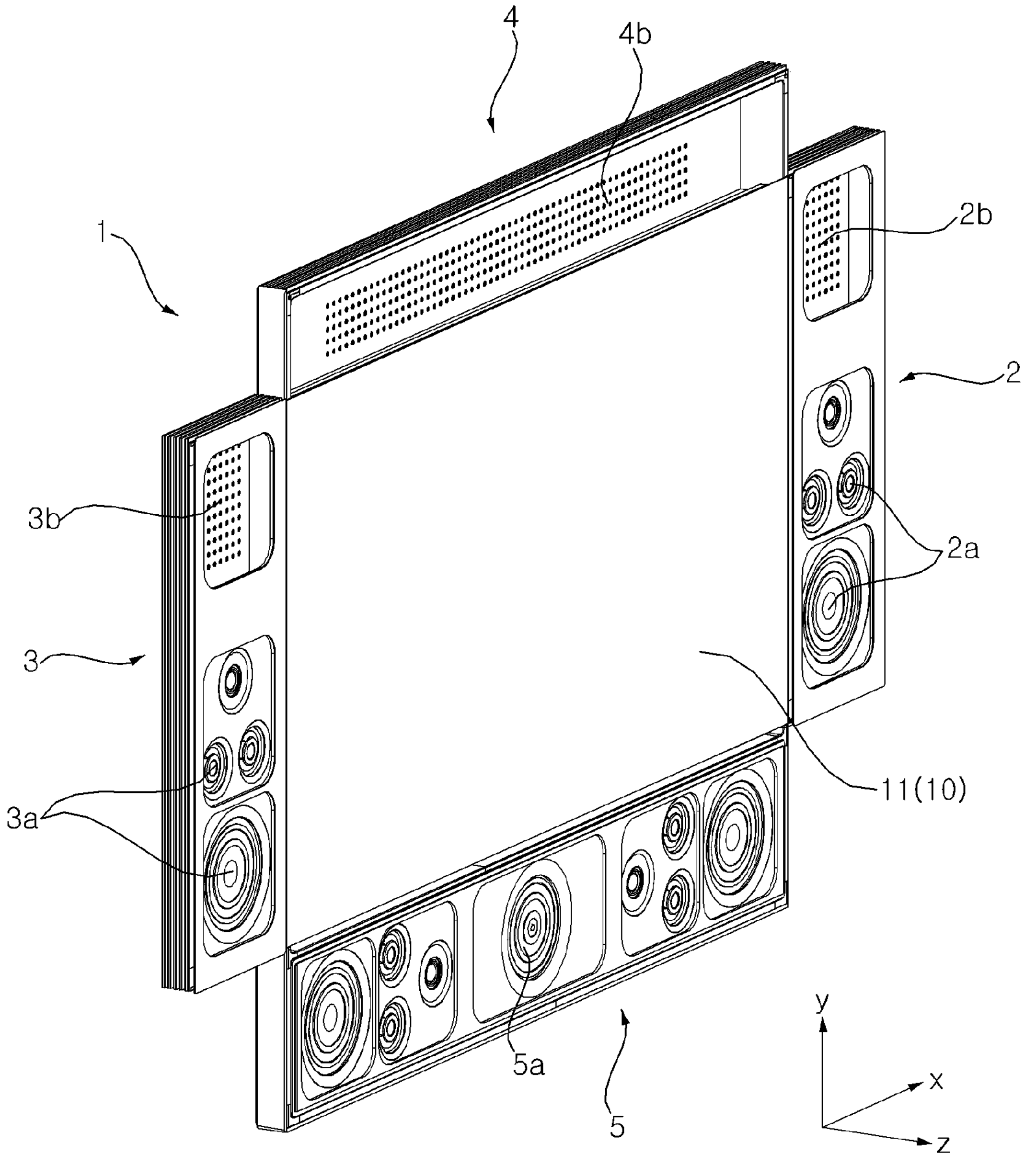

[FIG. 3]
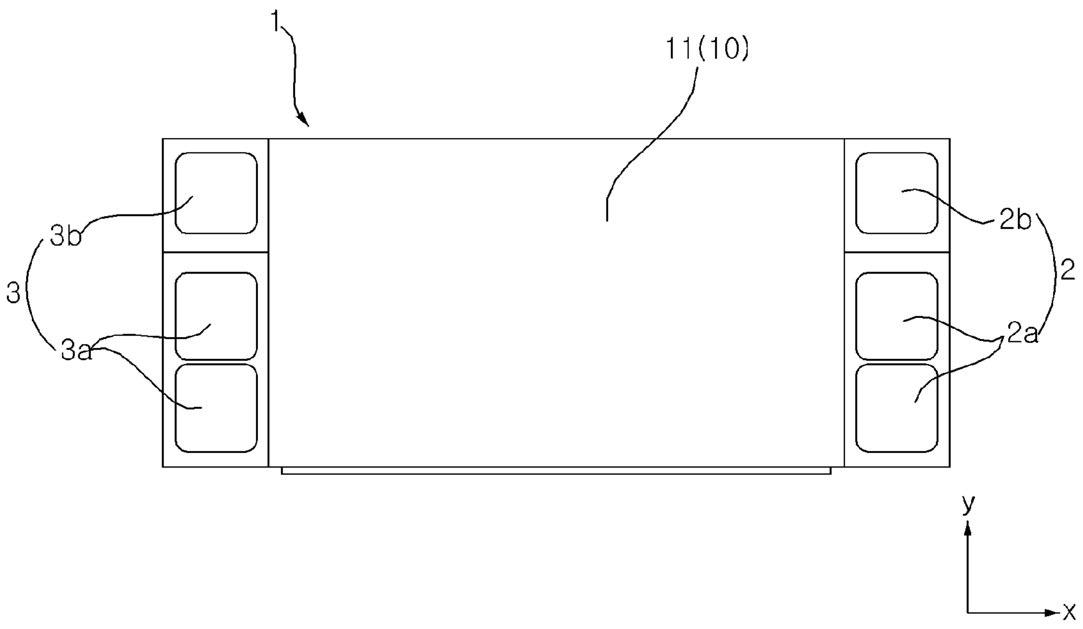

[FIG. 4]
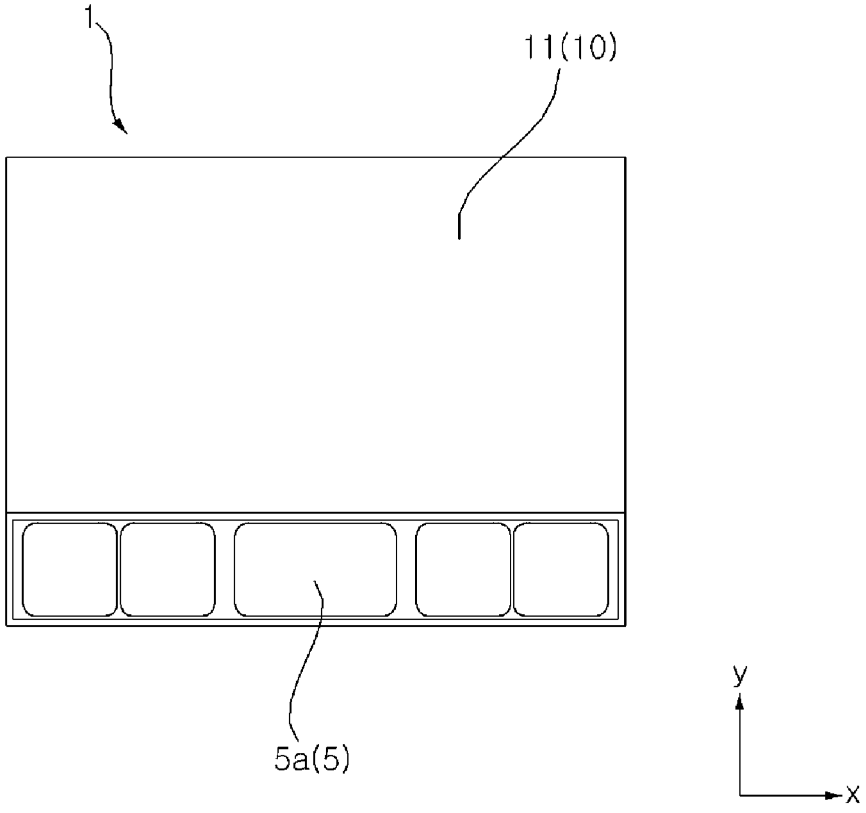

[FIG. 5]
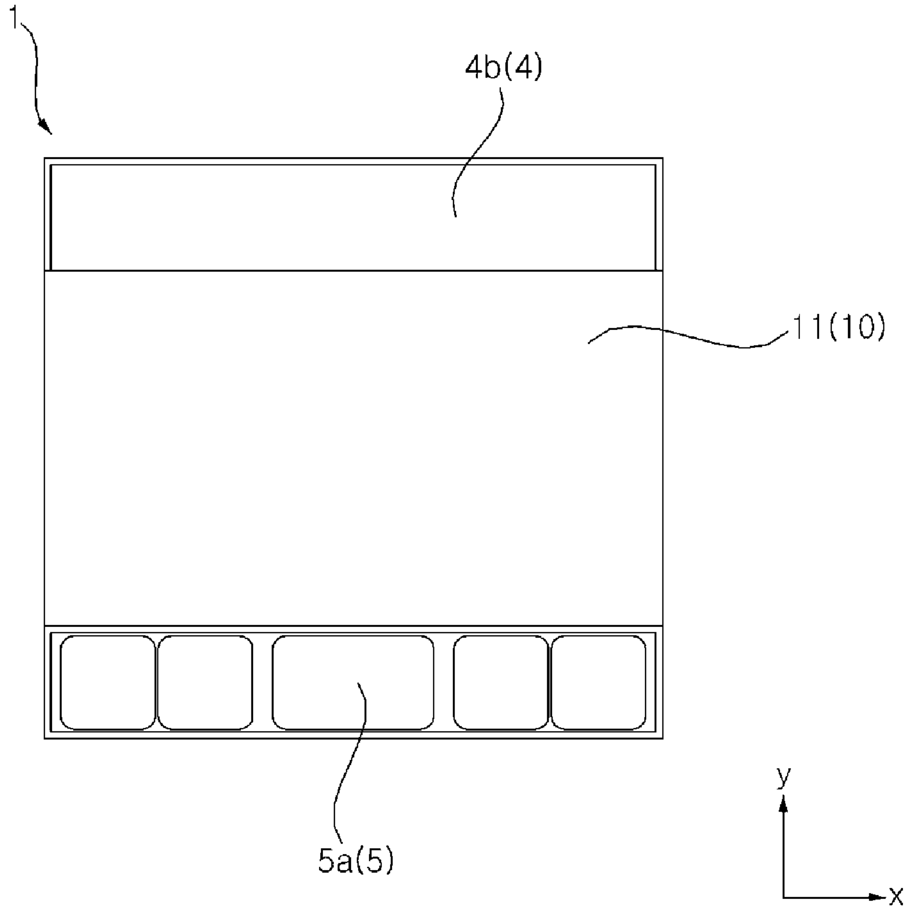

[FIG. 6]
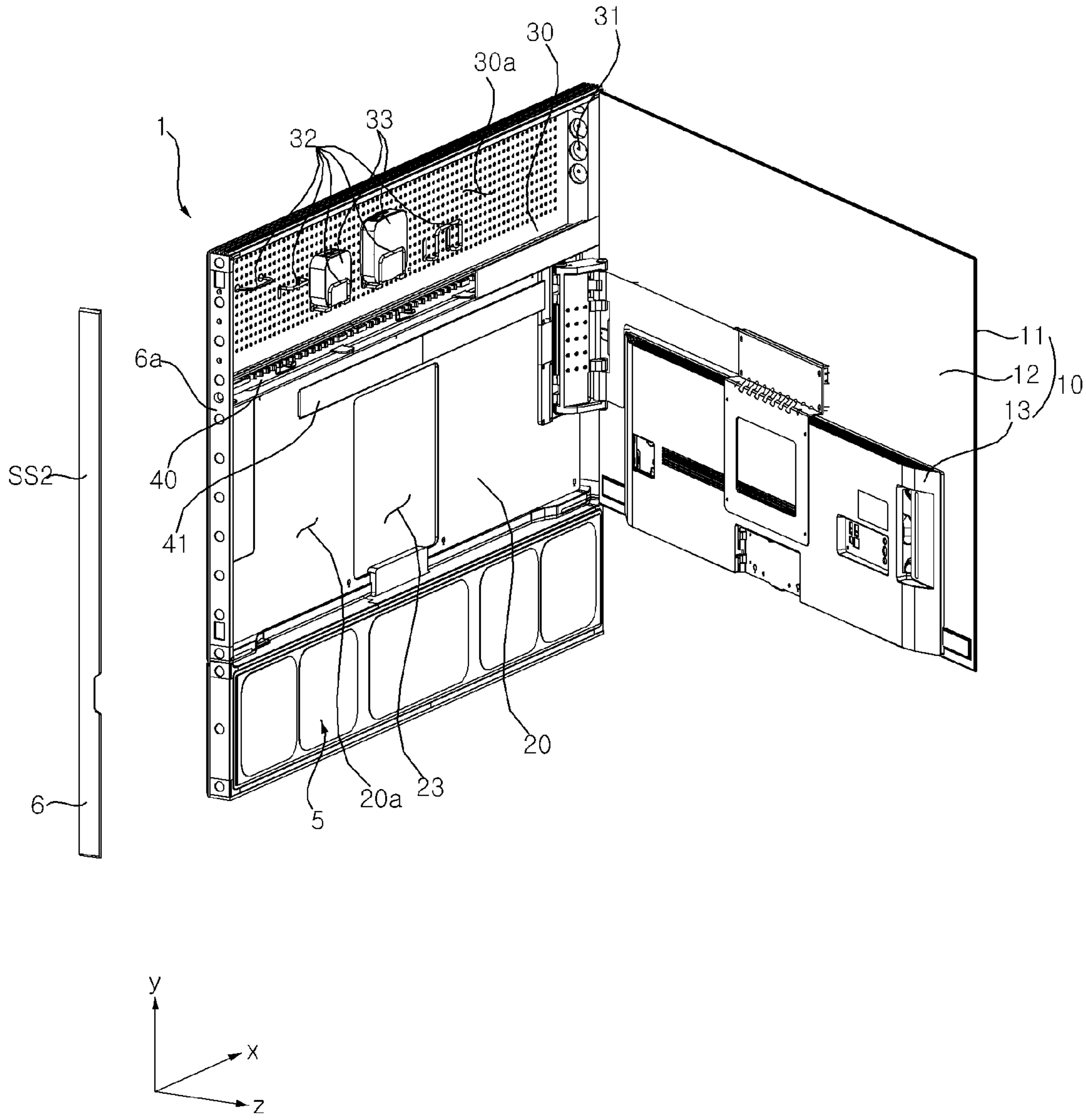

[FIG. 7]
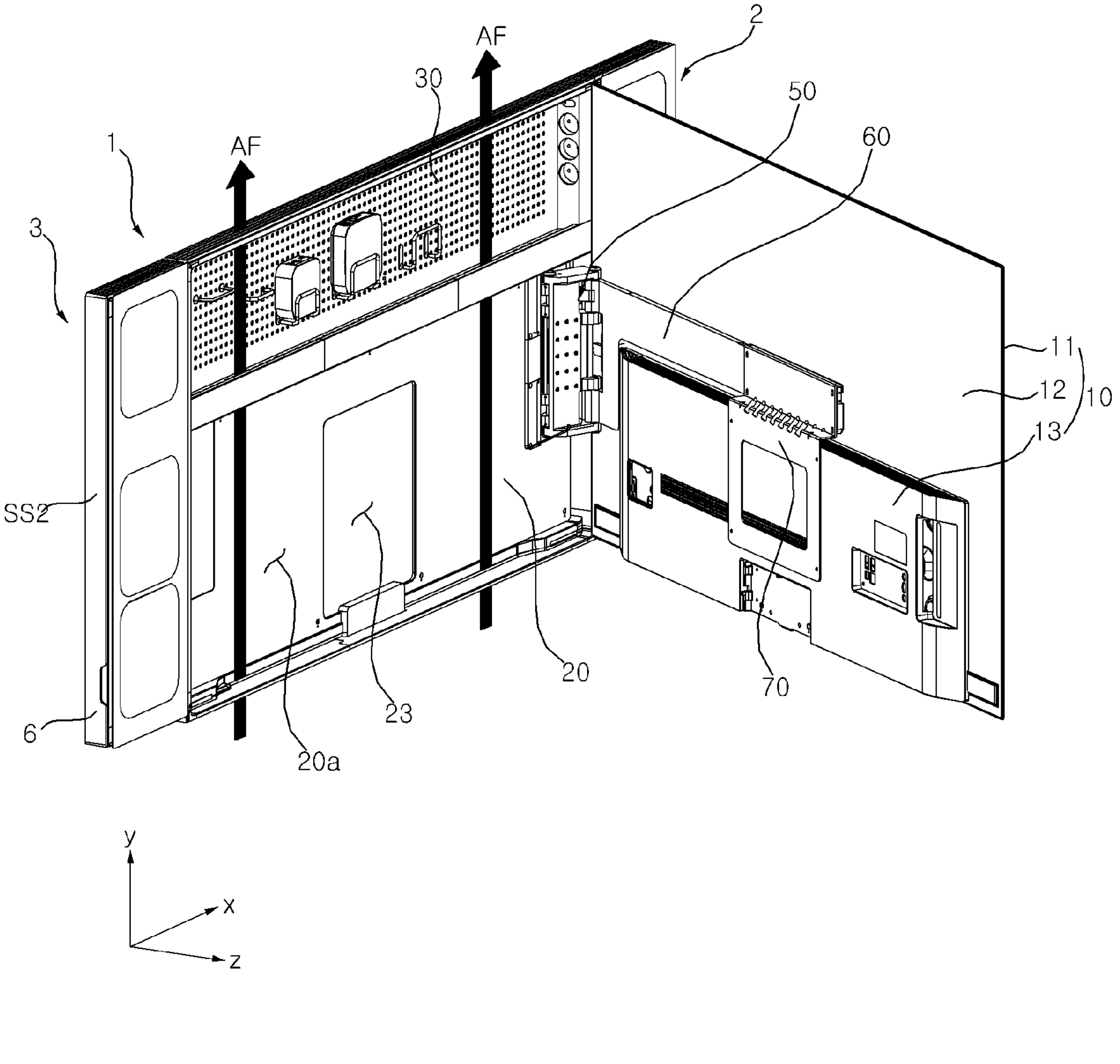

[FIG. 8]
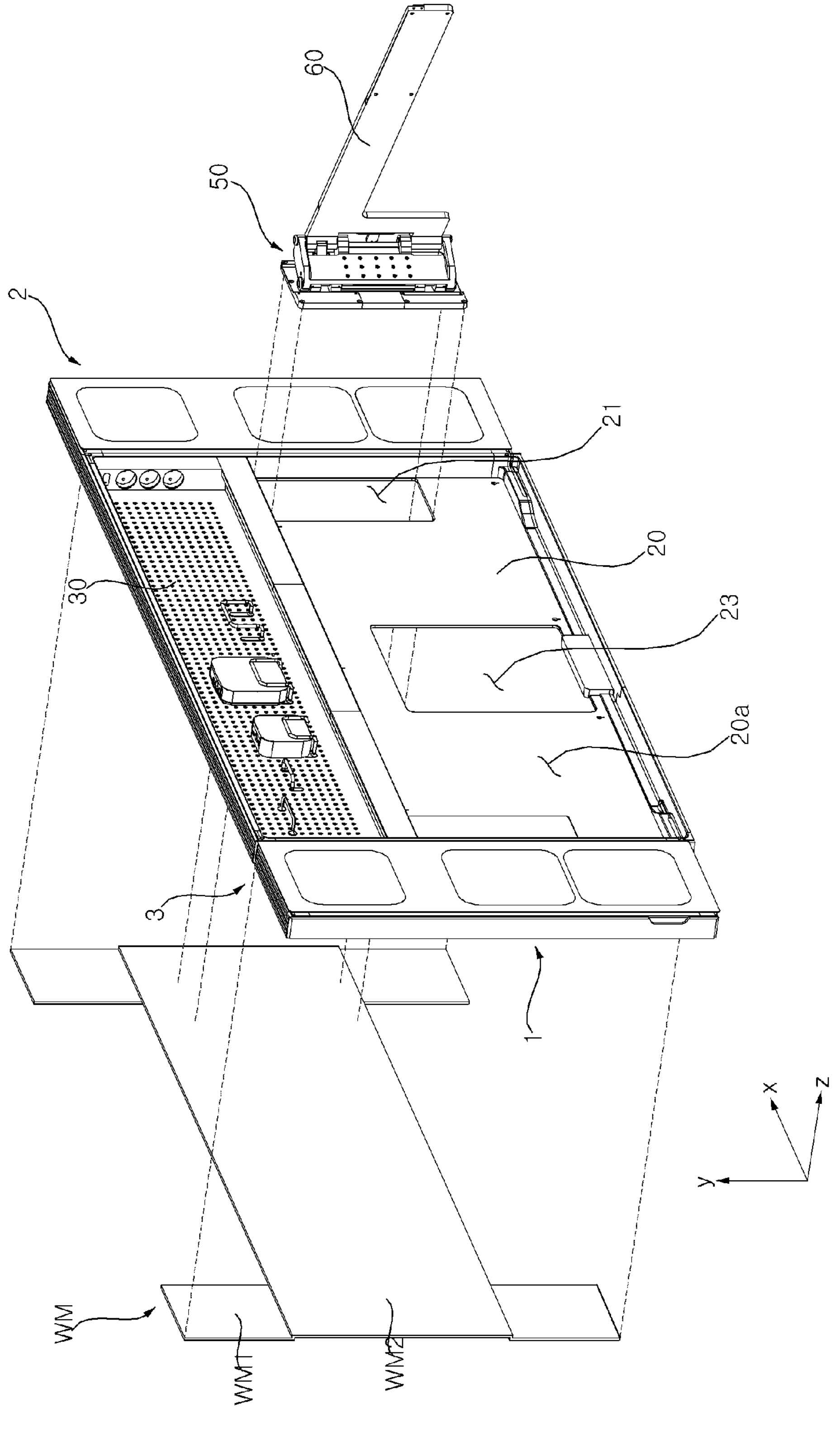

[FIG. 9]
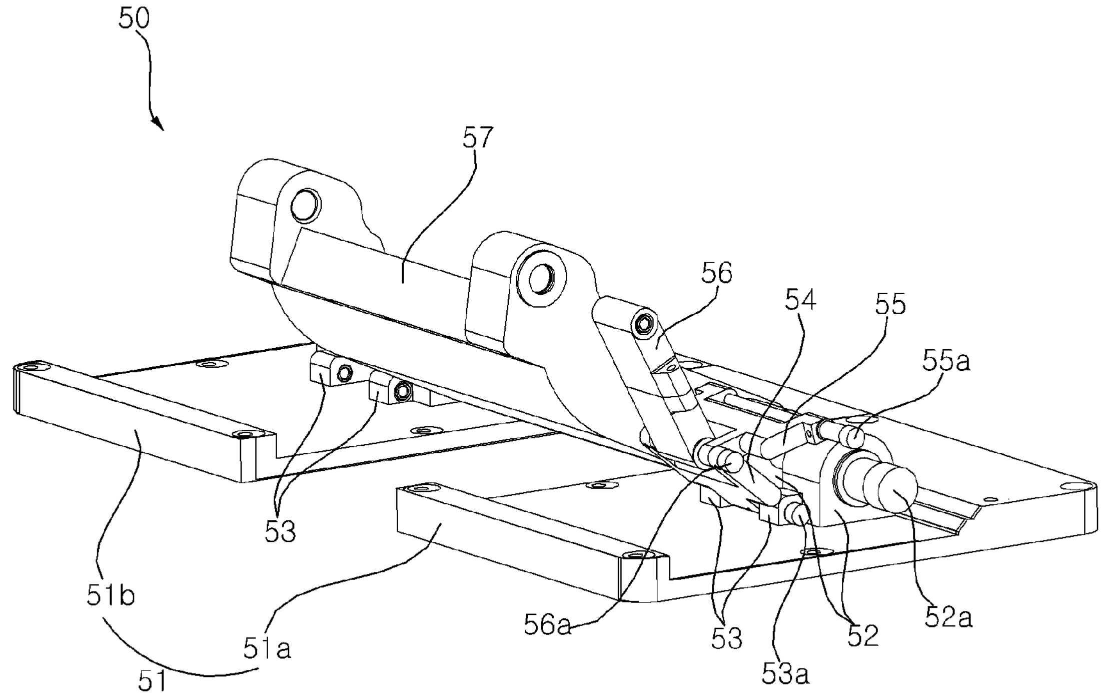

[FIG. 10]
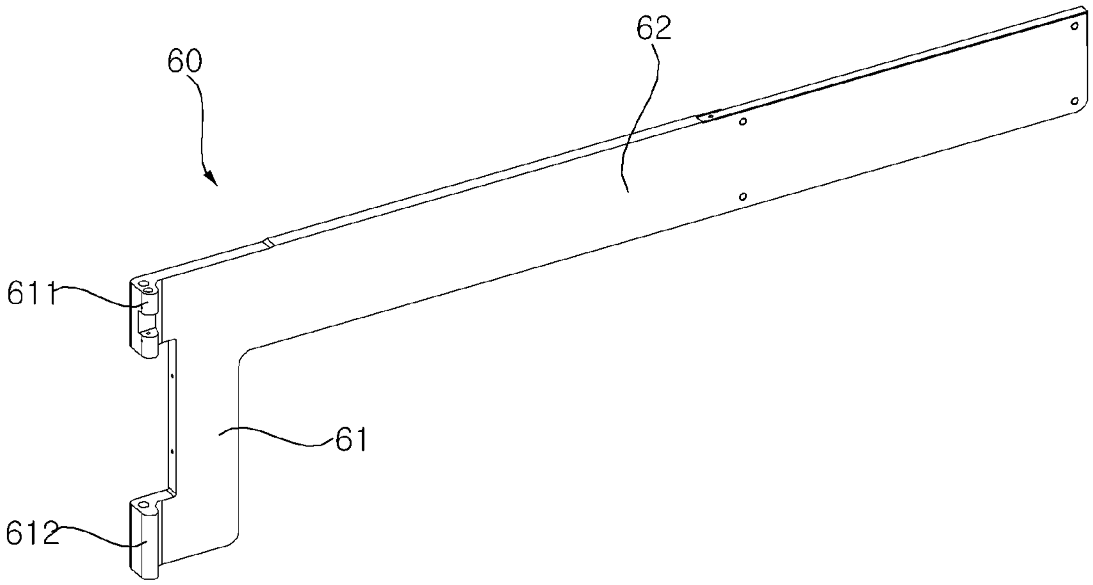

[FIG. 11]
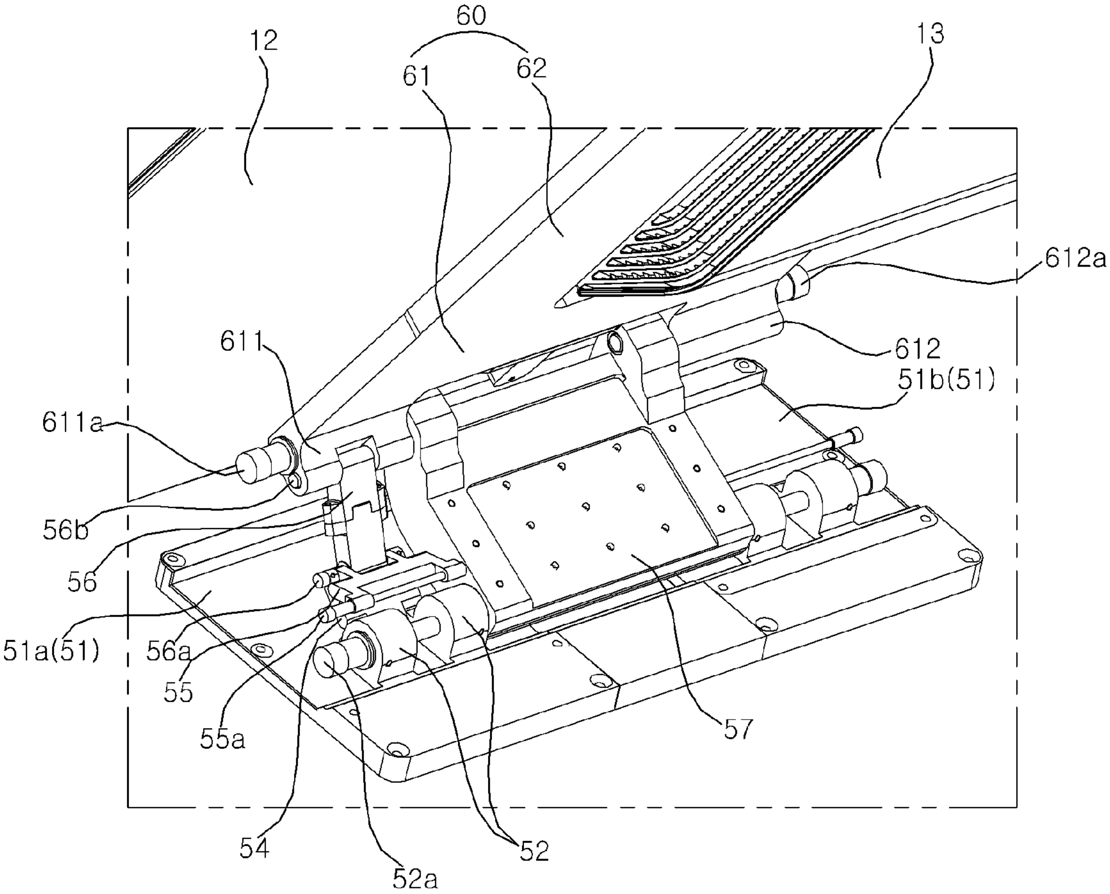

[FIG. 12]
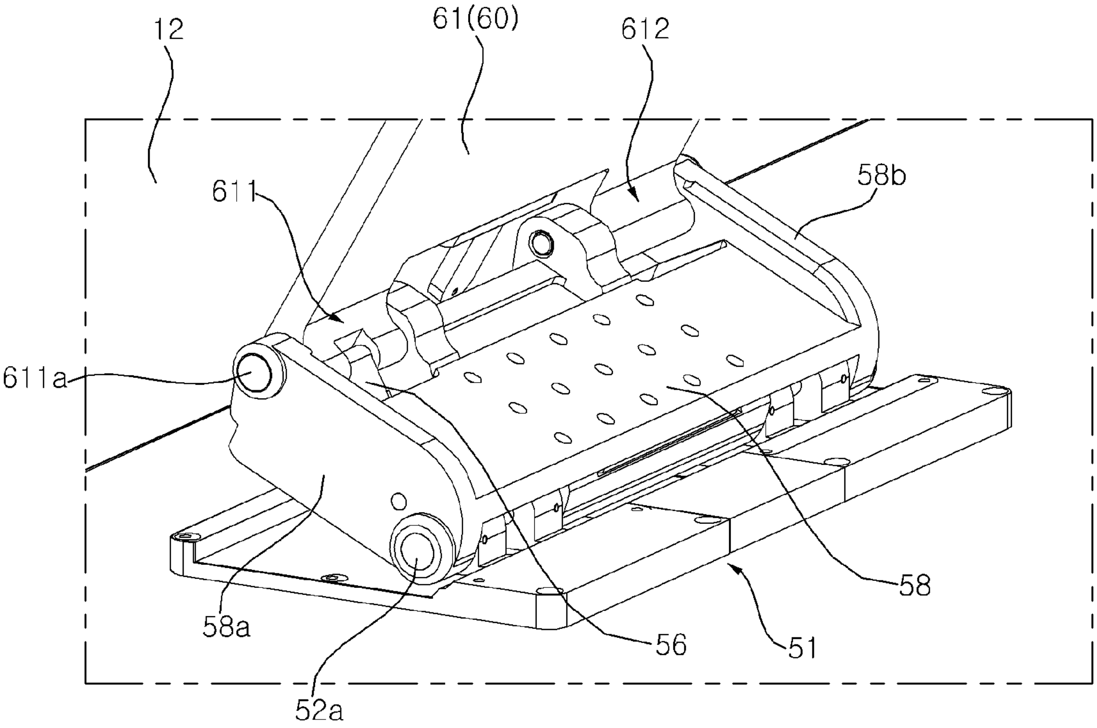

[FIG. 13]
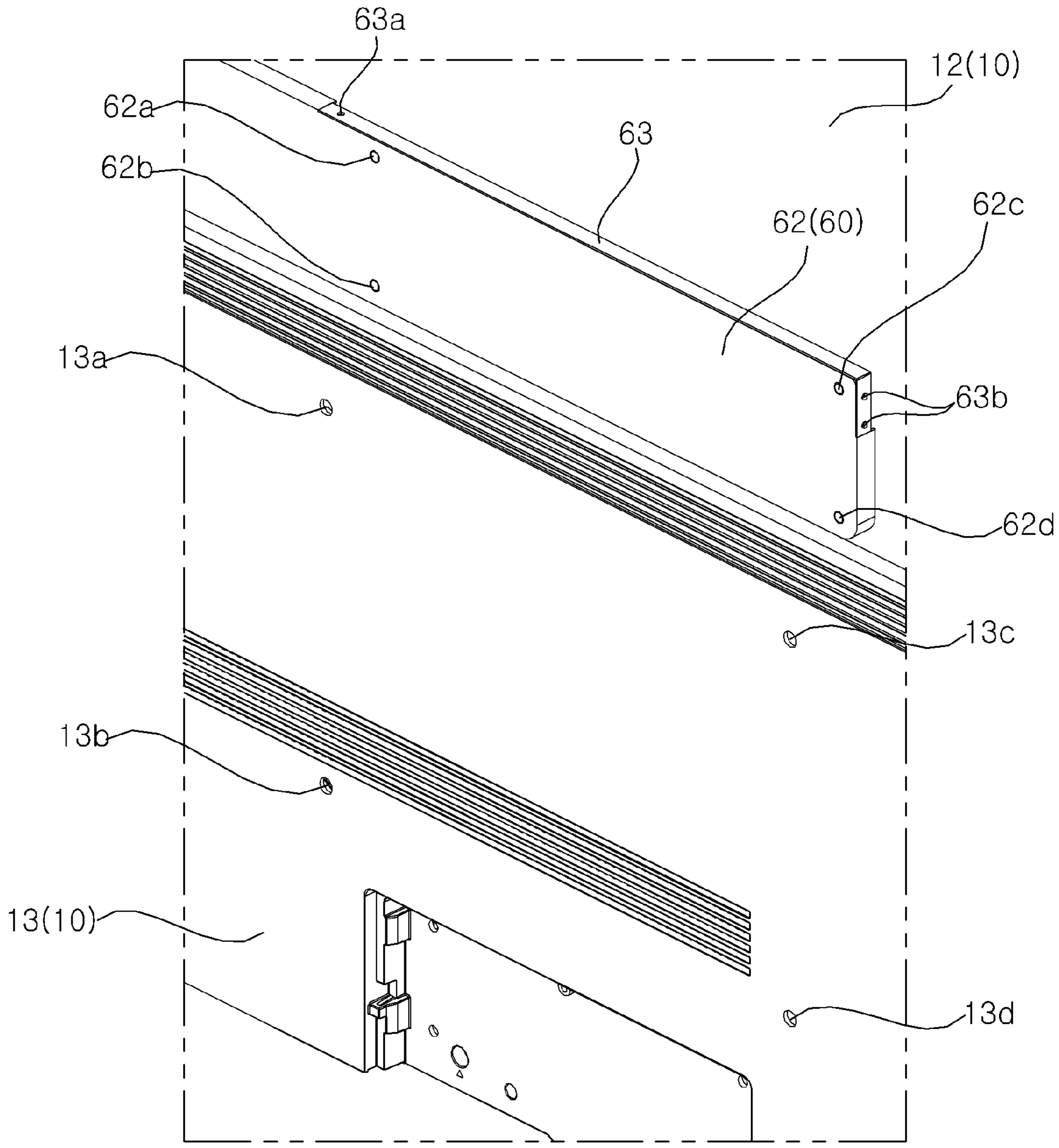

[FIG. 14]
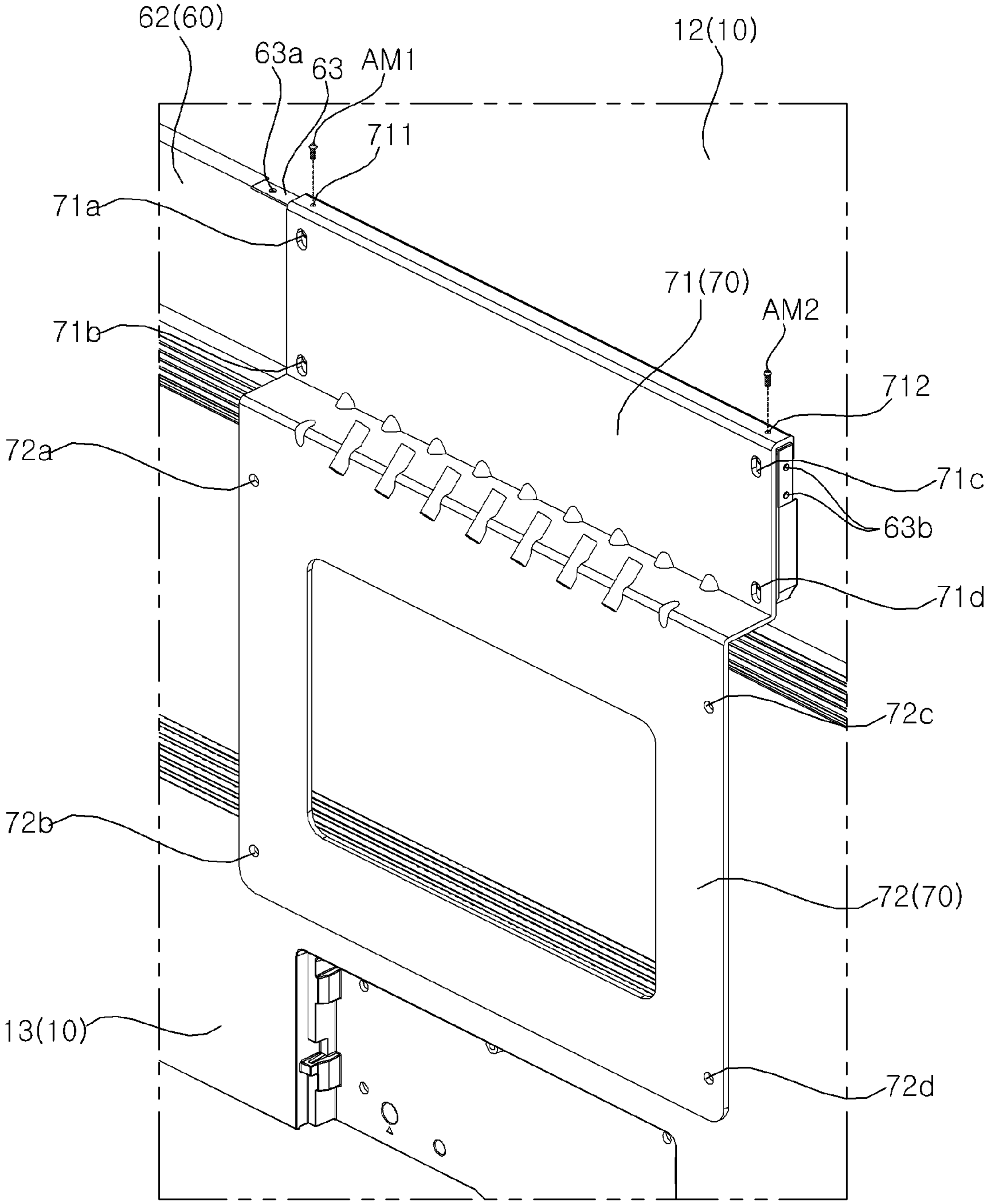

[FIG. 15]
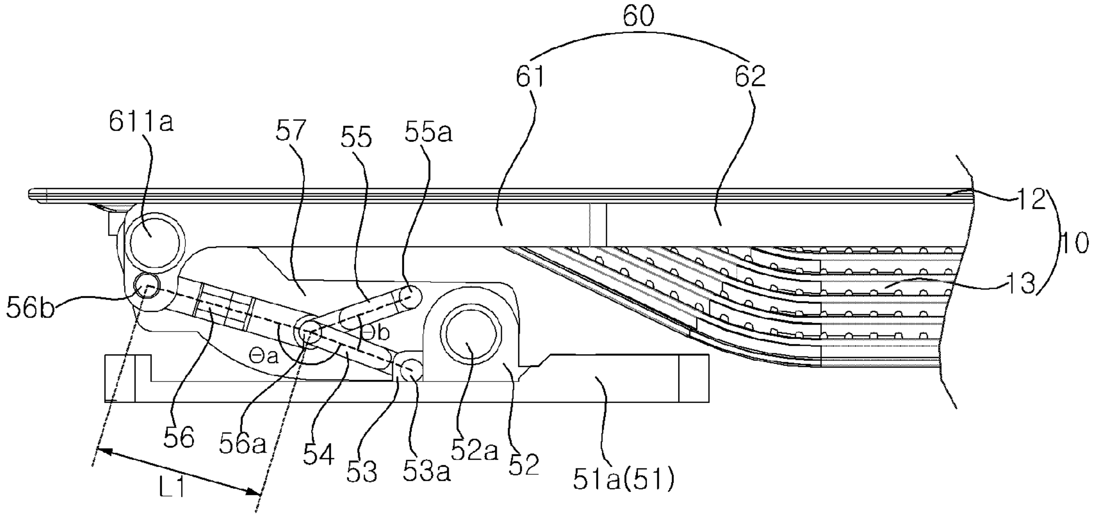

[FIG. 16]
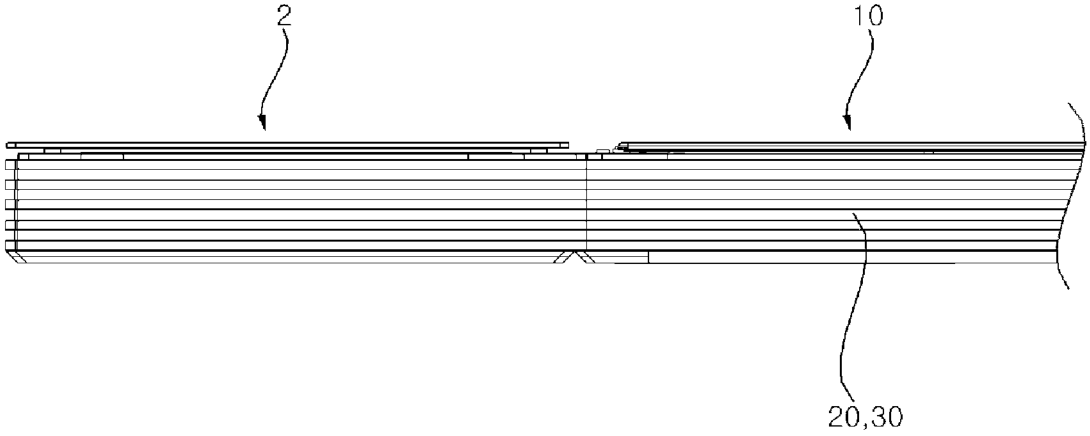

[FIG. 17]
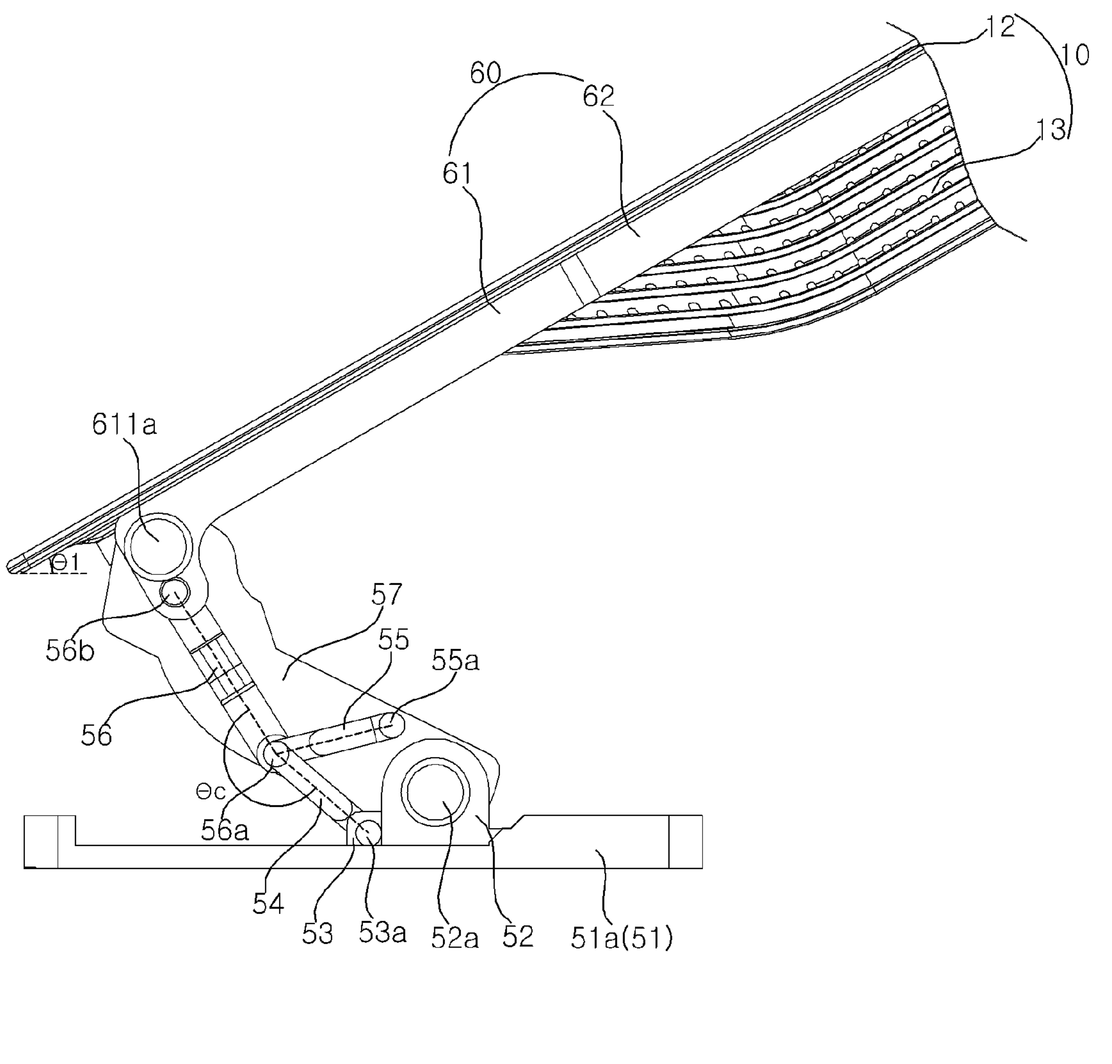

[FIG. 18]
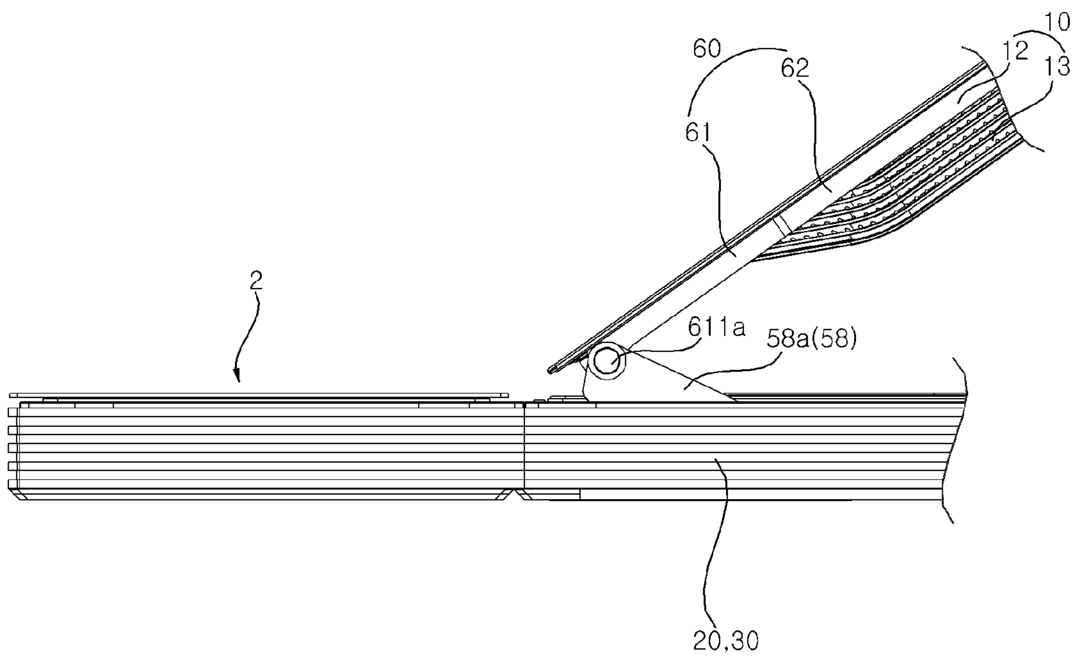

[FIG. 19]
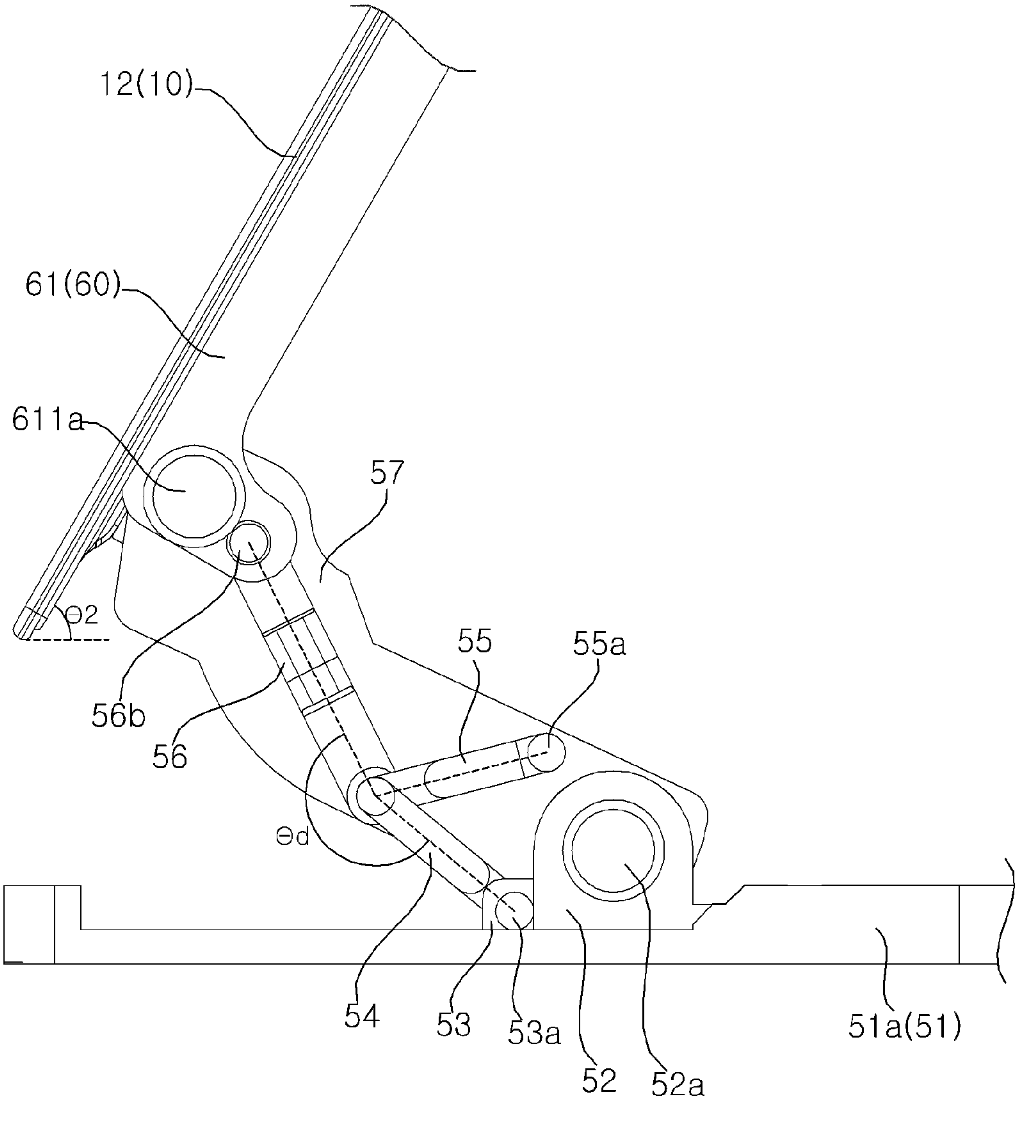

[FIG. 20]
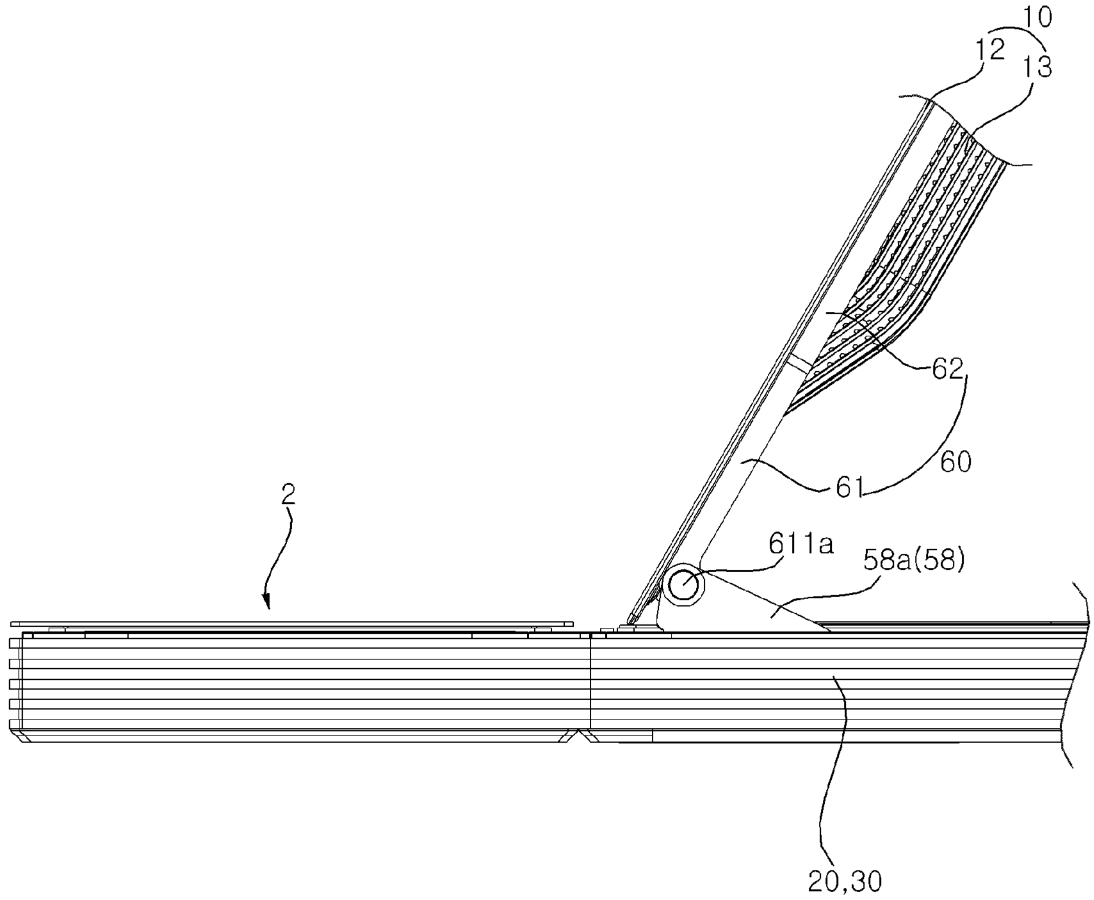

[FIG. 21]
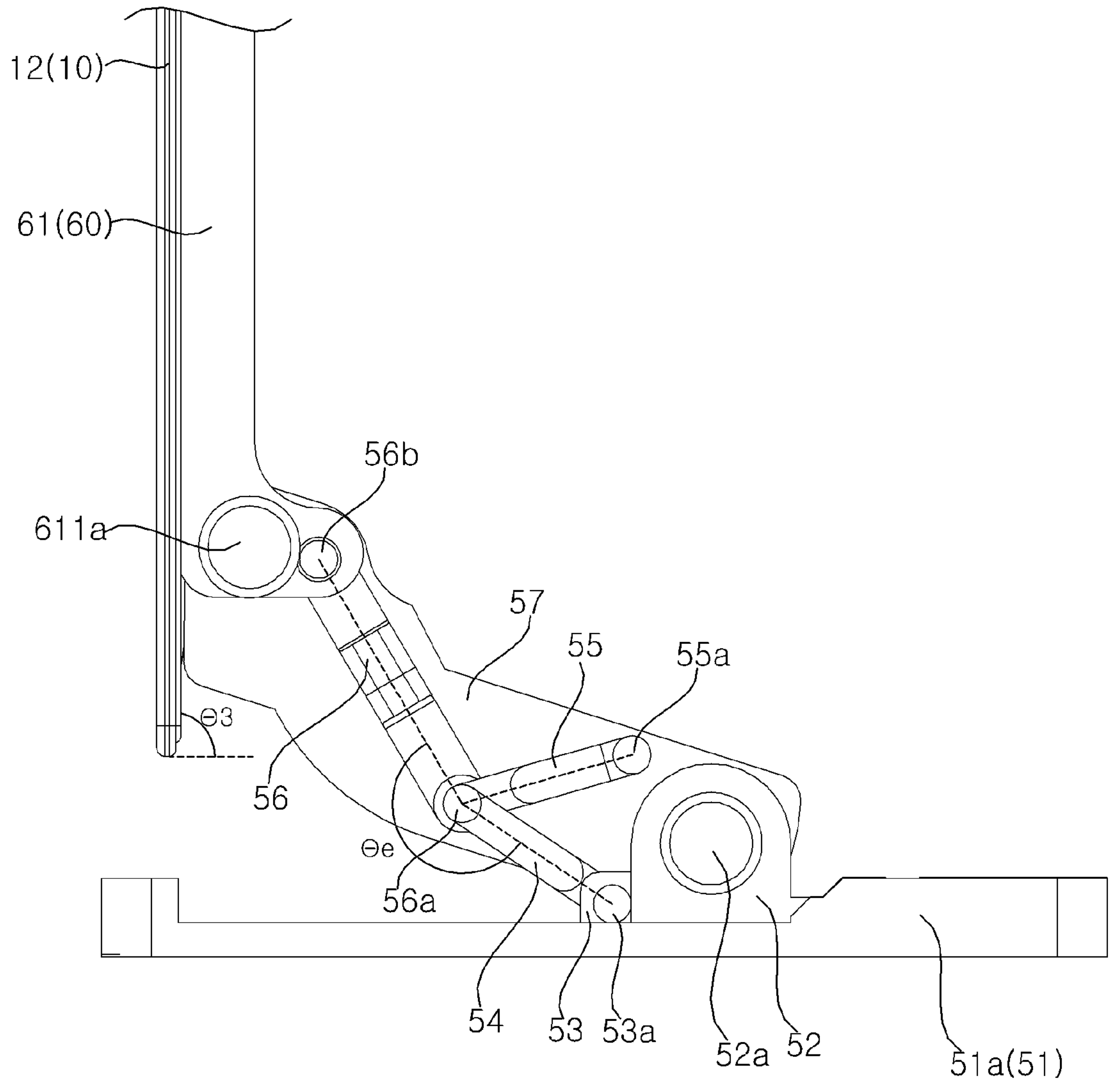

[FIG. 22]
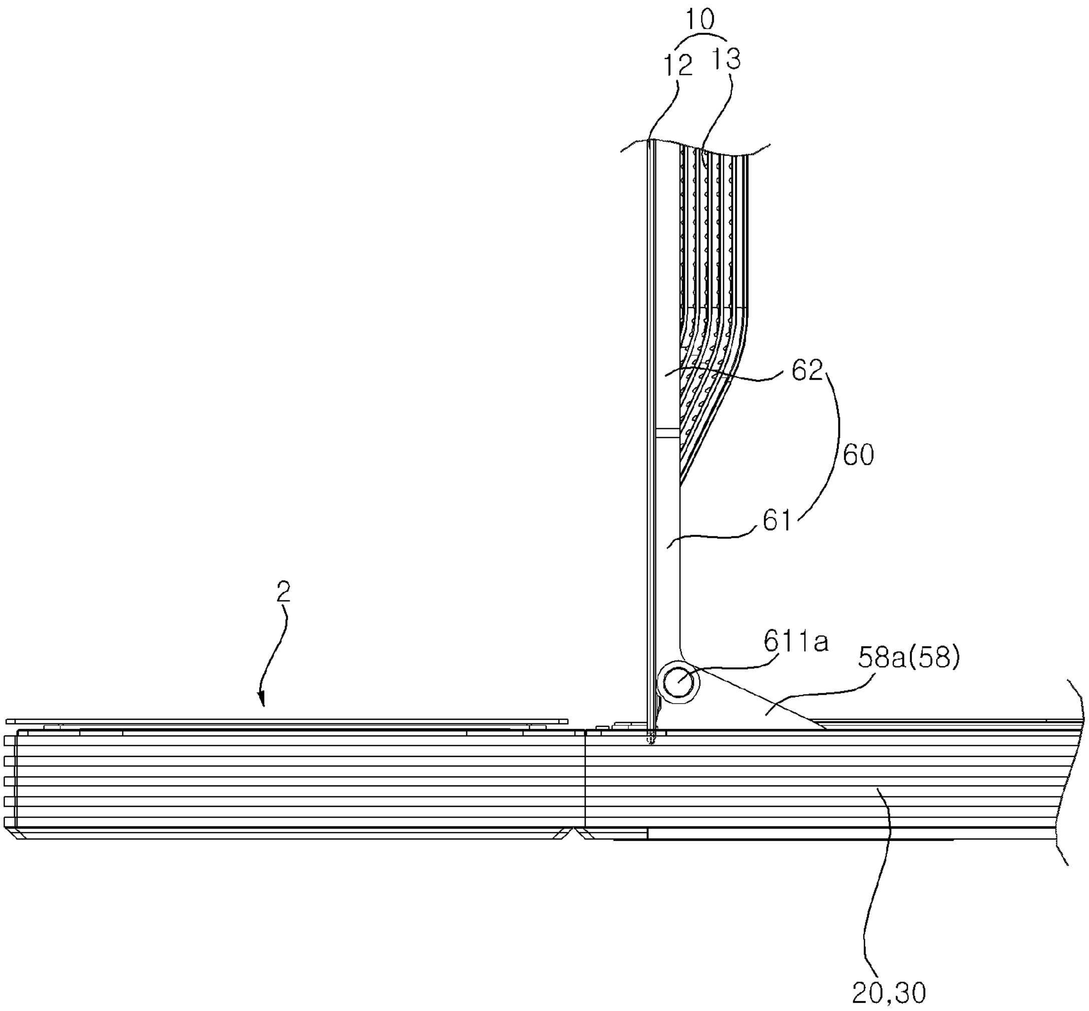

[FIG. 23]
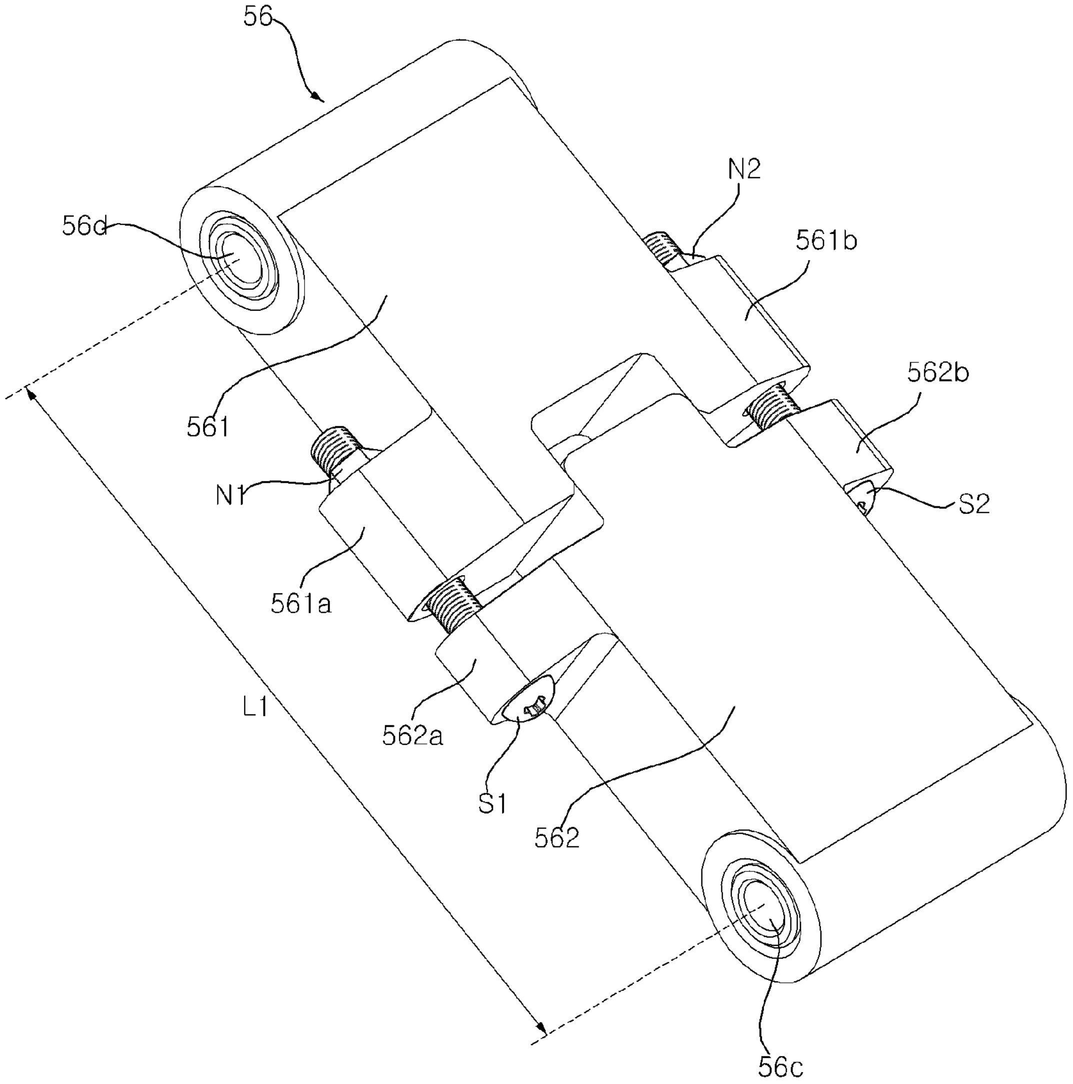

[FIG. 24]
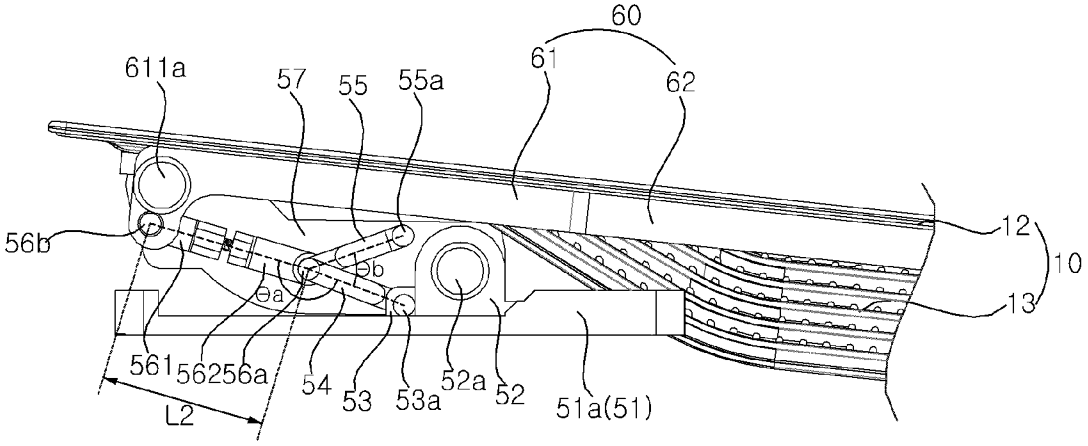

[FIG. 25]
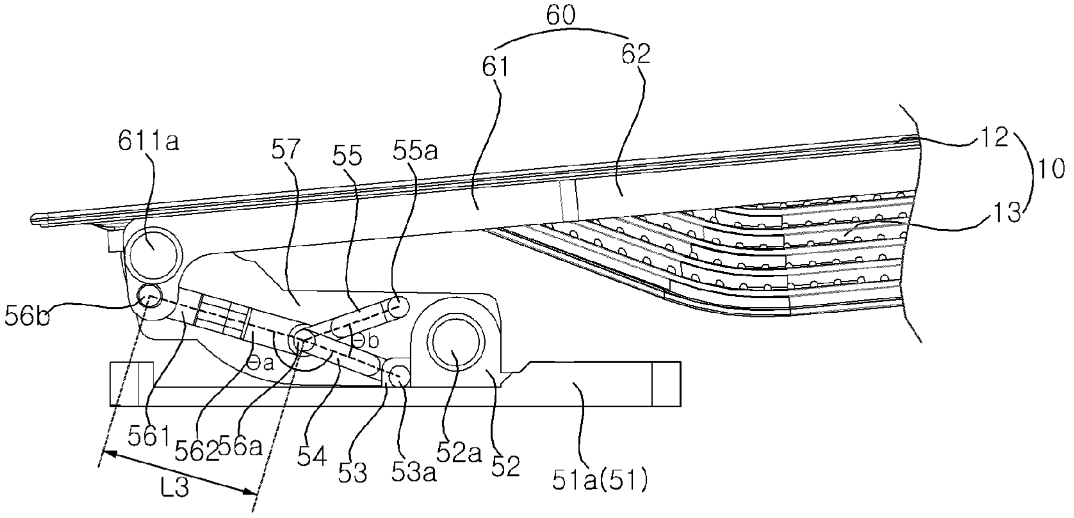

[FIG. 26]
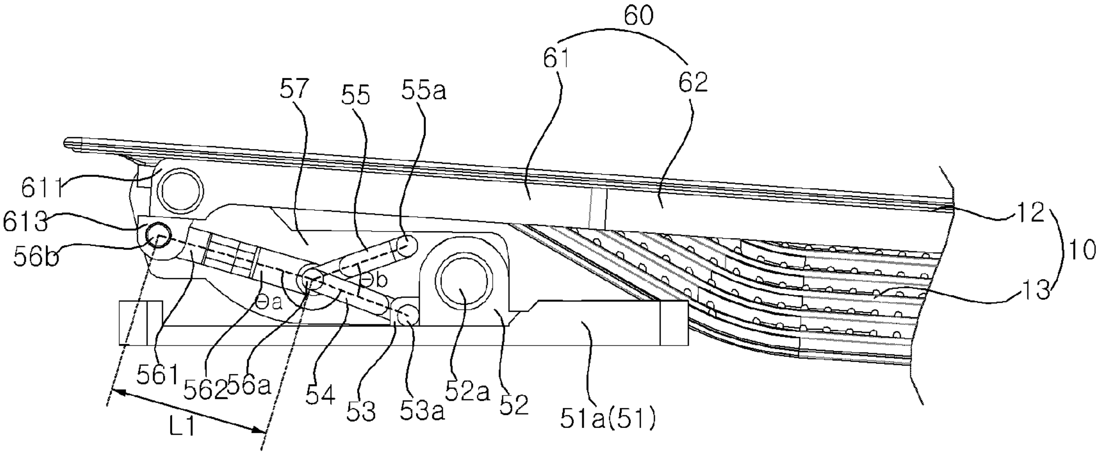

[FIG. 27]
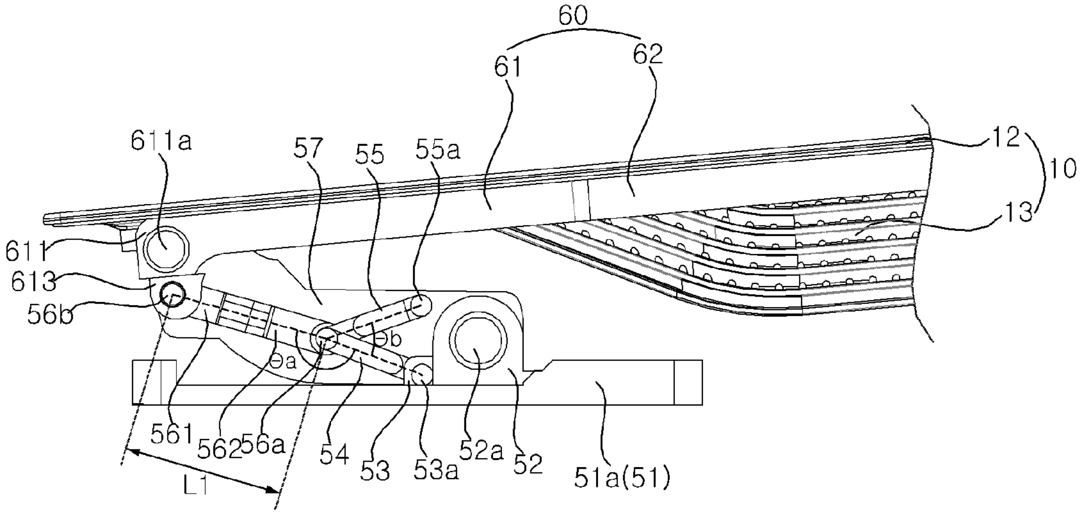

[FIG. 28]
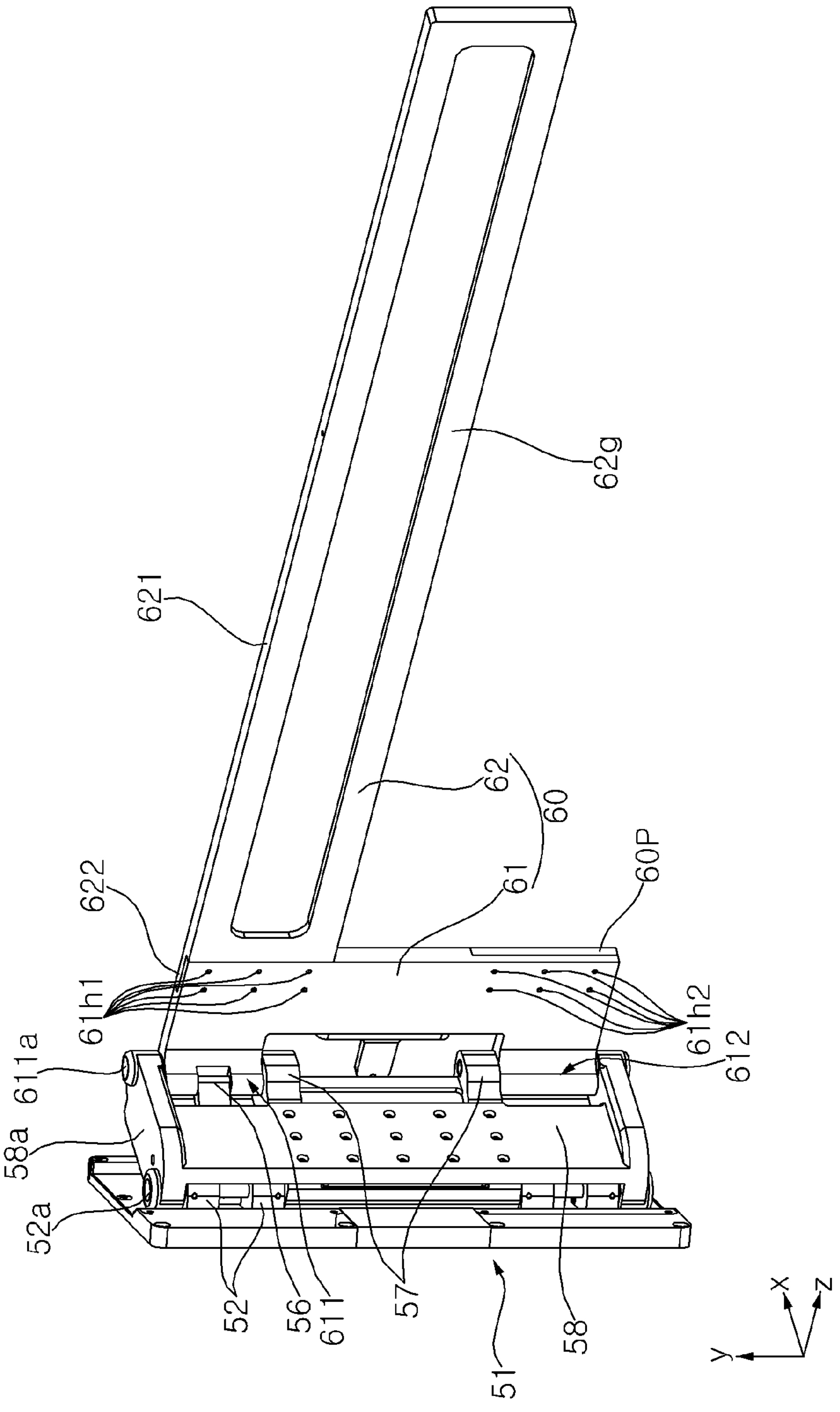

[FIG. 29]
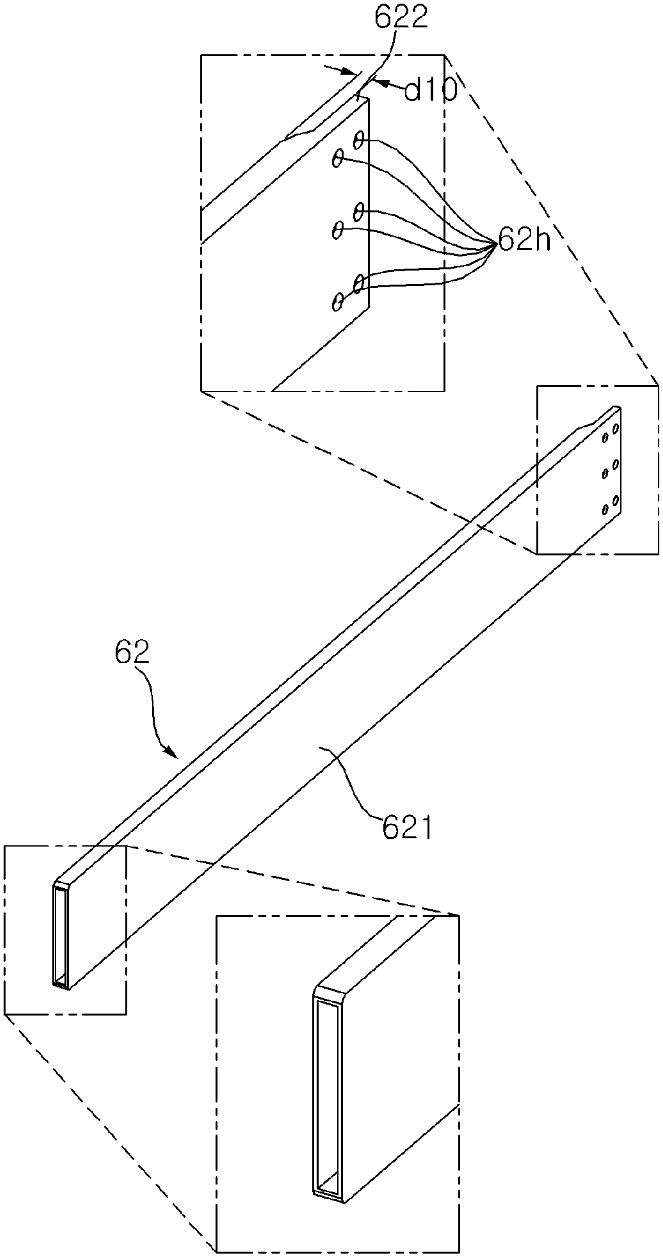

[FIG. 30]
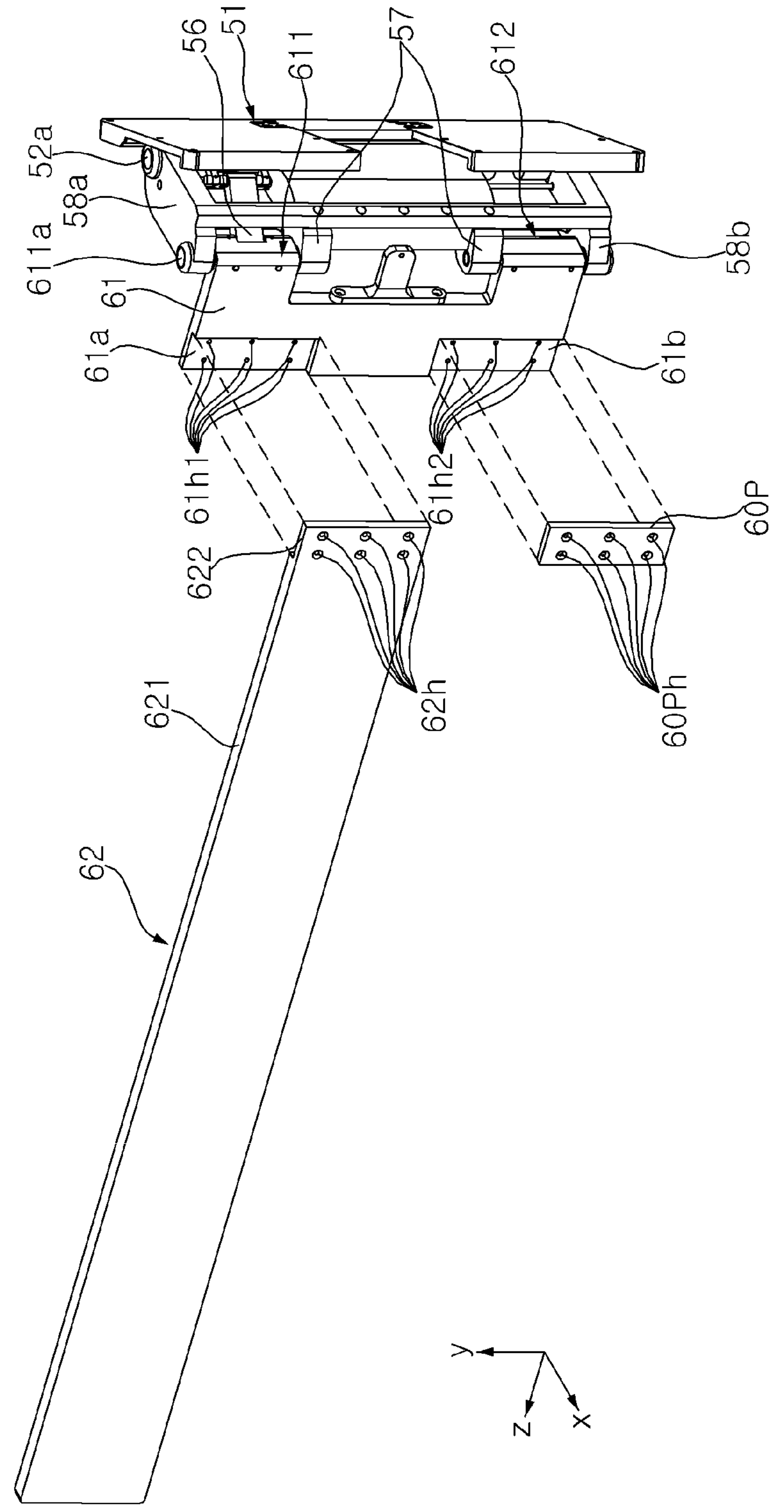

[FIG. 31]
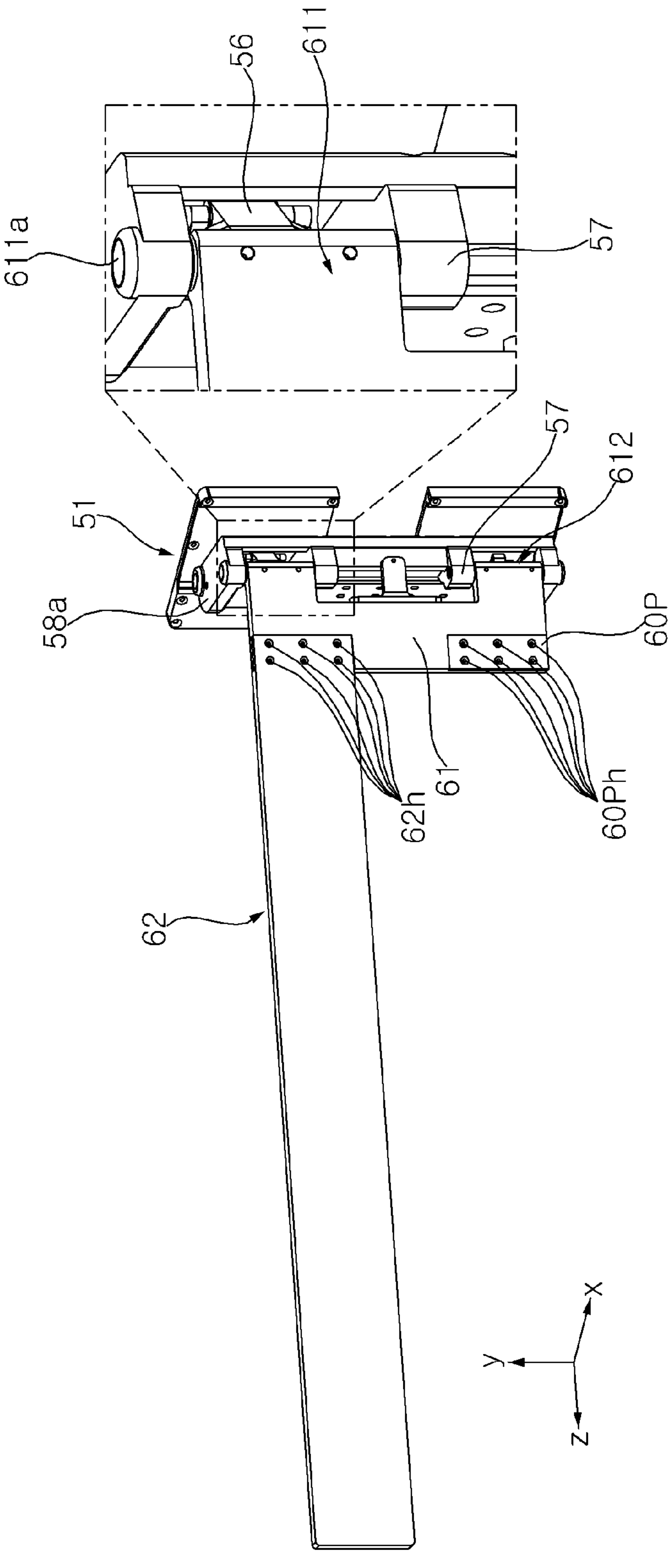

[FIG. 32]
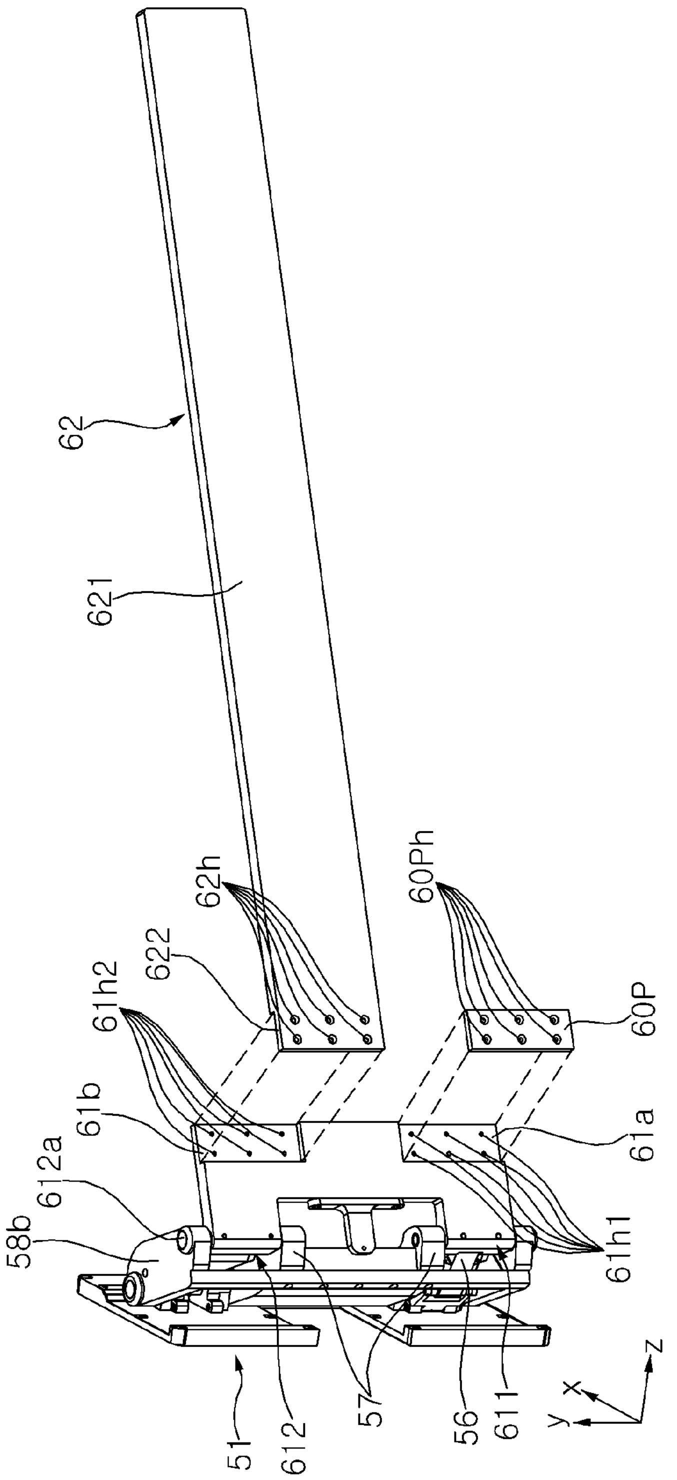

[FIG. 33]
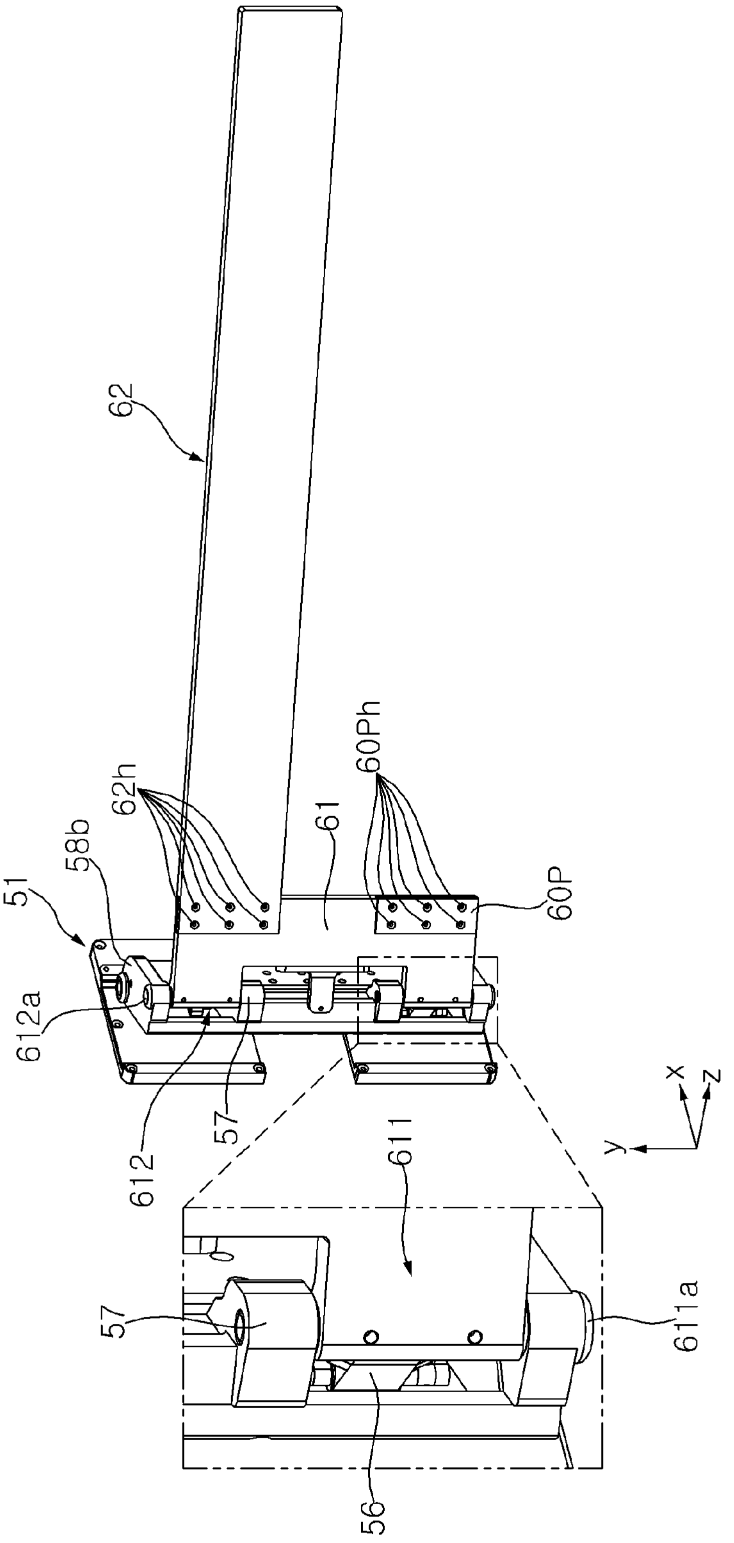

[FIG. 34]
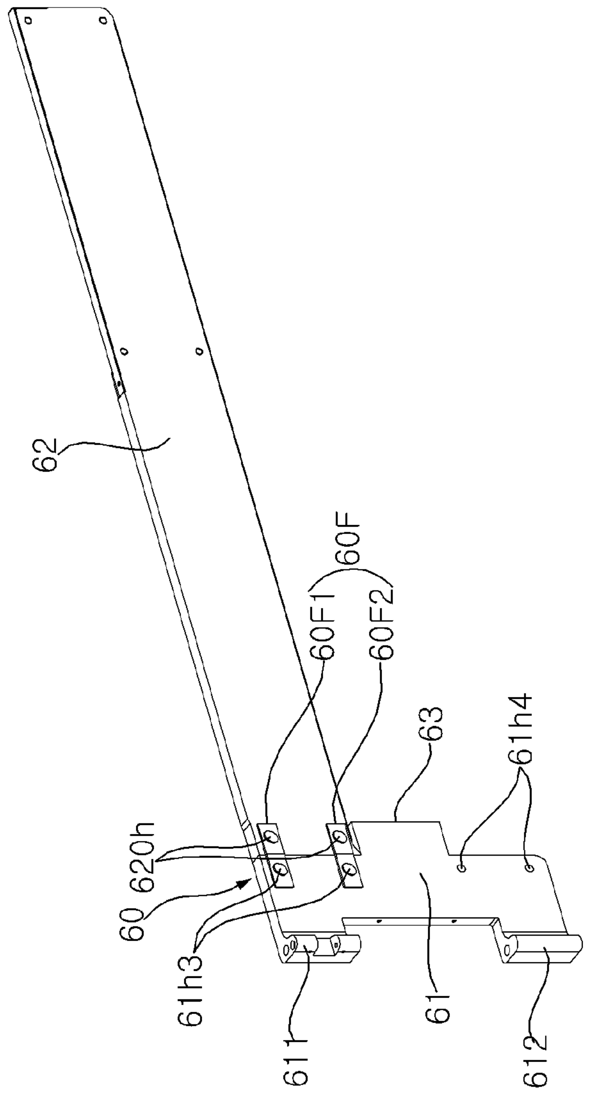

[FIG. 35]
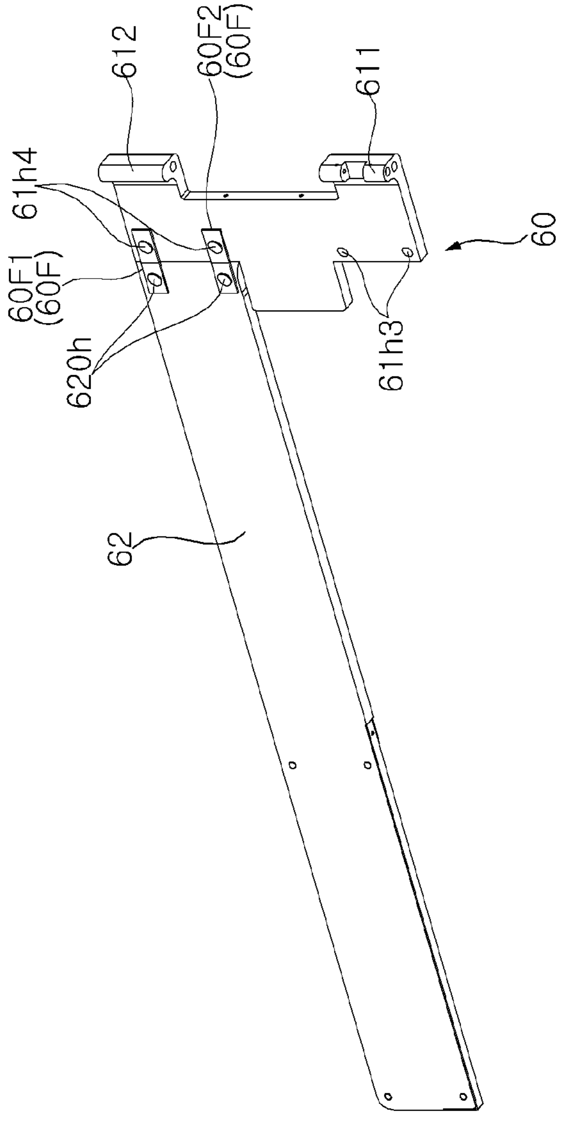

DISPLAY DEVICE

CROSS-REFERENCE TO RELATED APPLICATION(S)

This application is the National Stage filing under 35 U.S.C. 371 of International Application No. PCT/KR2022/009646, filed on Jul. 5, 2022, which claims the benefit of earlier filing date and right of priority to Korean Application No. 10-2021-0092828, filed on Jul. 15, 2021, the contents of which are all incorporated by reference herein in their entirety.

TECHNICAL FIELD

The present disclosure relates to a display device.

BACKGROUND ART

As information society develops, the demand for display devices is also increasing in various forms. In response to this, various display devices such as Liquid Crystal Display Device (LCD), Organic Light Emitting Diode (OLED), and Micro LED have been researched and used in recent years.

Among these, a liquid crystal panel includes a TFT substrate and a color filter substrate that face each other with a liquid crystal layer interposed therebetween, and may display an image by using light provided from a backlight unit. In addition, an OLED panel may display an image by depositing an organic material layer capable of self-emitting light on a substrate on which a transparent electrode is formed. In particular, a display device equipped with OLED panel has an advantage of being implemented in an ultra-thin type as it does not require a backlight unit.

Recently, much research has been conducted on a slim structure of display device.

DISCLOSURE OF INVENTION

Technical Problem

An object of the present disclosure is to solve the above-described problems and other problems.

Another object may be to provide a display device that can open and close the opening of a base or storage by using a hinged door method.

Another object may be to provide a display device that can add or expand a storage or speaker unit.

Another object may be to provide a structure that can remove heat from a display device.

Another object may be to provide a structure that can secure the rigidity of a bar connecting a head and a hinge.

Another object may be to provide a mechanism of a hinge mounted on the inside of a head.

Another object may be to provide a structure that can prevent rotation of a head from being interfered with by other components of a display device.

Another object may be to provide a structure that can adjust the level or tilt of a head.

Solution to Problem

According to an aspect of the present disclosure, a display device may include: a head including a display panel; a base positioned behind the head and having an opening formed in a front surface; and a hinge coupled to the head adjacent to one side of the head, and including a hinge axis parallel to the one side of the head, wherein the head may be rotatable about the hinge axis, and wherein the base may include a partition wall dividing an internal space of the base into at least two spaces.

Advantageous Effects of Invention

The effects of the display device according to the present disclosure will be described as follows.

According to at least one of the embodiments of the present disclosure, it is possible to provide a display device that can open and close the opening of a base or storage by using a hinged door method.

According to at least one of the embodiments of the present disclosure, it is possible to provide a display device that can add or expand a storage or speaker unit.

According to at least one of the embodiments of the present disclosure, it is possible to provide a structure that can remove heat from a display device.

According to at least one of the embodiments of the present disclosure, it is possible to provide a structure that can secure the rigidity of a bar connecting a head and a hinge.

According to at least one of the embodiments of the present disclosure, it is possible to provide a mechanism of a hinge mounted on the inside of a head.

According to at least one of the embodiments of the present disclosure, it is possible to provide a structure that can prevent rotation of a head from being interfered with by other components of a display device.

According to at least one of the embodiments of the present disclosure, it is possible to provide a structure that can adjust the level or tilt of a head.

Further scope of applicability of the present disclosure will become apparent from the following detailed description. However, it should be understood that the detailed description and specific embodiments such as preferred embodiments of the present disclosure are given by way of illustration only, since various changes and modifications within the spirit and scope of the present disclosure may be clearly understood by those skilled in the art.

BRIEF DESCRIPTION OF DRAWINGS

FIGS. 1 to 35 are diagrams illustrating examples of a display device according to embodiments of the present disclosure.

MODE FOR INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, although an embodiment is described with reference to a specific drawing, if necessary, reference numerals not appearing in the specific drawing may be mentioned, and reference numerals not appearing in the specific drawing shall be used when the reference numerals appear in the other figures.

Referring to FIG. 1, a display device 1 may include a display panel 11. The display panel 11 may display a screen.

The display device may include a first side SS1, a second side SS2 opposite to the first side SS1, a third side LS1 adjacent to the first side SS1 and the second side SS2, and a fourth side LS2 opposite to the third side LS1.

The direction parallel to the third and fourth sides LS1 and LS2 of the display device 1 may be referred to as a left-right direction or a first direction DR1. The direction parallel to the first and second sides SS1 and SS2 of the display device 1 may be referred to as an up-down direction or a second direction DR2. The direction perpendicular to the third and fourth sides LS1 and LS2 and the first and second sides SS1 and SS2 of the display device 1 may be referred to as a front-rear direction or a third direction DR3.

The direction in which the display panel 11 displays images may be referred to as a front (F, z), and the opposite direction may be referred to as a rear R. A side of the first side SS1 may be referred to as a left (Le, x), and the first side SS1 may be referred to as a left side. The second side SS2 may be referred to as a right side Ri, and the second side SS2 may be referred to as a right side. A side of the third side LS1 may be referred to as an upper side (U, y), and the third side LS1 may be referred to as an upper side. A side of the fourth side LS2 may be referred to as a lower side D, and the fourth side LS2 may be referred to as a lower side.

The first side SS1, the second side SS2, the third side LS1, and the fourth side LS2 may be referred to as an edge of the display device 1. A point where the first side SS1, the second side SS2, the third side LS1, and the fourth side LS2 meet each other may be referred to as a corner.

For example, a point where the first side SS1 and the third side LS1 meet may be referred to as a first corner C1. A point where the third side LS1 and the second side SS2 meet may be referred to as a second corner C2. A point where the second side SS2 and the fourth side LS2 meet may be referred to as a third corner C3. A point where the fourth side LS2 and the first side SS1 meet may be referred to as a fourth corner C4.

Referring to FIG. 2, at least one case 2, 3, 4, and 5 may be adjacent to an edge of the display panel 11. The case 2, 3, 4, and 5 may be referred to as a housing or cabinet. Meanwhile, a cover (not shown) may be detachably coupled to the case 2, 3, 4, and 5, and may cover the front of the case 2, 3, 4, and 5.

A first case 2 may be adjacent to the left side of the display panel 11, and may extend along the left side of the display panel 11. For example, a first speaker unit 2*a* may be installed in an internal space of a first case 2, and may provide sound to the front, left, and/or lower side of the display device 1. For example, a first storage 2*b* may be formed inside the first case 2, and may be opened in a forward direction. A plurality of holes (no reference numeral) may be formed in the rear surface of a portion forming the first storage 2*b* of the first case 2. The first storage 2*b* may be spaced apart from the first speaker unit 2*a*. Meanwhile, any one of the first speaker unit 2*a* and the first storage 2*b* may be omitted. The first case 2 may be referred to as a left case, the first speaker unit 2*a* may be referred to as a left speaker unit, and the first storage 2*b* may be referred to as a left storage.

A second case 3 may be adjacent to the right side of the display panel 11, and may extend along the right side of the display panel 11. For example, a second speaker unit 3*a* may be installed in the internal space of the second case 3, and may provide sound to the front, right, and/or lower side of the display device 1. For example, a second storage 3*b* may be formed inside the second case 3, and may be opened in a forward direction. A plurality of holes (no reference numeral) may be formed in the rear surface of a portion forming the second storage 3*b* of the second case 3. The second storage 3*b* may be spaced apart from the second speaker unit 3*a*. Meanwhile, any one of the second speaker unit 3*a* and the second storage 3*b* may be omitted. The second case 3 may be referred to as a right case, the second speaker unit 3*a* may be referred to as a right speaker unit, and the second storage 3*b* may be referred to as a right storage.

A third case 4 may be adjacent to the upper side of the display panel 11, and may extend along the upper side of the display panel 11. For example, a third storage 4*b* may be formed inside the third case 4, and may be opened in a forward direction. A plurality of holes (no reference numeral) may be formed in the rear surface of a portion forming the third storage 4*b* of the third case 4. For example, a third speaker unit (not shown) may be installed in the internal space of the third case 4, and may provide sound to the front, left, right, and/or upper side of the display device 1. In this case, the third speaker unit may be spaced apart from the third storage 4*b*. Meanwhile, any one of the third storage 4*b* and the speaker unit may be omitted. The third case 4 may be referred to as an upper case, the third storage 4*b* may be referred to as an upper storage, and the third speaker unit may be referred to as an upper speaker unit.

A fourth case 5 may be adjacent to the lower side of the display panel 11, and may extend along the lower side of the display panel 11. For example, the fourth speaker unit 5*a* may be installed in the inner space of the fourth case 5, and may provide sound to the front, left, right, and/or lower side of the display device 1. For example, a fourth storage (not shown) may be formed inside the fourth case 5, and may be opened in a forward direction. In this case, the fourth storage may be spaced apart from the fourth speaker unit 5*a*. Meanwhile, any one of the fourth speaker unit 5*a* and the fourth storage may be omitted. The fourth case 5 may be referred to as a lower case, the fourth speaker unit 5*a* may be referred to as a lower speaker unit, and the fourth storage may be referred to as a lower storage.

For example, cables, accessories, tools, etc. may be stored in the storage described above.

Referring to FIG. 3, the first case 2 may be disposed in the left side of the display panel 11, and the second case 3 may be disposed in the right side of the display panel 11. Accordingly, the first speaker unit 2*a* of the first case 2 and the second speaker unit 3*a* of the second case 3 may provide a three-dimensional sound to a user. In addition, a user may store various types of items or organize cables in the first storage 2*b* of the first case 2 and the second storage 3*b* of the second case 3.

Referring to FIG. 4, the fourth case 5 may be disposed in the lower side of the display panel 11. Accordingly, the fourth speaker unit 5*a* of the fourth case 5 may provide sound to a user. In this case, the fourth speaker unit 5*a* may extend long in the left-right direction, and may provide three-dimensional sound to a user.

Referring to FIG. 5, the third case 4 may be disposed in the upper side of the display panel 11, and the fourth case 5 may be disposed in the lower side of the display panel 11. Accordingly, the fourth speaker unit 5*a* of the fourth case 5 may provide sound to a user. In this case, the fourth speaker unit 5*a* may extend long in the left-right direction, and may provide three-dimensional sound to a user. In addition, a user may store various types of items or organize cables in the third storage 4*b* of the third case 4.

Referring to FIGS. 6 and 7, the base 20, 30 may form the rear surface of the display device 1. The base 20, 30 may have an overall square shape, and may be opened in a forward direction. For example, the base 20, 30 may include a metal material. For example, the base 20, 30 may include a material having an excellent heat transfer performance. The first case 2 may be detachably coupled to the left side of the base 20, 30, and the second case 3 may be detachably coupled to the right side of the base 20, 30 (see FIG. 7). For example, the height of each of the first case 2 and the second case 3 may be substantially the same as the height of the base 20, 30. The third case 4 may be detachably coupled to the upper side of the base 20, 30, and the fourth case 5 may be detachably coupled to the lower side of the base 20, 30. For example, the width of each of the third case 4 and the fourth case 5 may be substantially the same as the width of the base 20, 30.

The side cover 6 may be detachably coupled to one side of the base 20, 30 and/or one side of the case 2, 3, 4, 5, and may form an edge of the display device 1. For example, when the display device 1 is provided with the fourth case 5, the side cover 6 may be coupled to the upper side of the base 20, 30, the lower side of the fourth case 5, the left side of the base 20, 30, the left side of the fourth case 5, the right side of the base 20, 30, and the right side of the fourth case 5, and may form an edge of the display device 1 (see FIG. 6). For example, when the display device 1 is provided with the first case 2 and the third case 3, the side cover 6 may be coupled to the upper side of the base 20, 30, the upper side of the case 2, 3, the lower side of the base 20, 30, the lower side of the case 2, 3, the left side of the first case 2, and the right side of the second case 3, and may form an edge of the display device 1 (see FIG. 7).

The base 20, 30 may include a first base 20, and a second base 30 located above the first base 20. For example, the first base 20 and the second base 30 may be formed as one body. For another example, the second base 30 may be detachably coupled to the upper portion of the first base 20.

The internal space of the base 20, 30 of a partition wall 40 may be divided into at least two spaces. The partition wall 40 may be located between the first base 20 and the second base 30, may protrude in a forward direction from the base 20, 30, and may extend long in the left-right direction. The partition wall 40 may divide the internal space of the base 20, 30 into an internal space 20*a* of the first base 20 and an internal space 30*a* of the second base 30. The cover 41 may intersect the partition wall 40, and may be detachably coupled to the front end of the partition wall 40.

A plurality of holes (no reference numeral) may be formed on the rear surface of the second base 30. A plurality of holders 32 may be fixed to the plurality of holes. A plurality of articles 33 may be placed on a plurality of holders 32. The holder 32 may be referred to as a rack or cradle. A multi tap 31 may be fixed to the inside of the second base 30. For example, the multi-tap 31 may be provided at the left or right distal end of the second base 30. The multi tap 31 may be referred to as a power strip or multi plug.

Accordingly, electronic components, accessories, tools, cables, etc. may be disposed in the internal space 30*a* of the second base 30, and a power line connected to the multi-tap 31 may be disposed. In addition, at least a portion of the cable and the power line may be disposed between the second base 30 and the cover 41. In addition, the cable and the power line may be connected to the speaker unit described above or the electronic components of the head 10 described later.

The head 10 may include a display panel 11, a frame 12, and a back cover 13. The head 10 may be referred to as a display unit or display module.

For example, display panel 11 may be an OLED panel, an LCD panel, or an LED panel. The display panel 11 may divide an image into a plurality of pixels and output an image to be adjusted with color, brightness, and saturation for each pixel. The display panel 11 may be divided into an active area where images are displayed and a de-active area where images are not displayed. The display panel 11 may generate light corresponding to the color of red, green, or blue according to a control signal.

The frame 12 may be located in a rear of the display panel 11, and the display panel 11 may be coupled thereto. For example, the frame 12 may include a metal material such as aluminum alloy.

The back cover 13 may cover at least a portion of the rear of the frame 12. A plurality of electronic components (not shown) may be located between the frame 12 and the back cover 13, and may be fixed to the frame 12. A plurality of input or output terminals may be provided in one side of the back cover 13. For example, the back cover 13 may include a metal material. For another example, the back cover 13 may be an injection molded product of resin. The back cover 13 may be disposed in the internal space 20*a* of the first base 20. Accordingly, the thickness of the display device 1 may be minimized. Meanwhile, a bracket 70 may be fixed to the rear surface of the back cover 13, and inserted into the hole 23 formed in the base 20. For example, the bracket 70 may include a metal material.

The hinge 50 may be located between the base 20 and the head 10. The hinge 50 may be adjacent to one side of the head 10 and coupled to the head 10, and may provide a hinge axis parallel to the one side of the head 10. That is, the head 10 may rotate or swivel about the hinge axis of the hinge 50. The hinge 50 may be adjacent to one side of the base 20, 30 adjacent to the one side of the head 10. For example, the hinge 50 may be adjacent to the left side of the head 10 and the left side of the base 20, 30. For another example, the hinge 50 may be adjacent to the right side of the head 10 and the right side of the base 20, 30. That is, the hinge 50 and its related structure may be interchangeable from side to side.

Accordingly, when the head 10 rotates about the hinge axis of the hinge 50, the other side of the head 10 and the other side of the base 20, 30 may move away from or become closer to each other. In other words, the head 10 may open or close the front of the base 20, 30.

Meanwhile, slits (no reference numeral) may be formed in the lower and upper sides of the base 20, 30, and the partition wall 40. Accordingly, the heat of the display device 1 may be removed by the airflow AF passing through the slits. For example, a fan (not shown) may be installed inside the base 20, 30, and may cause air to flow through the slits.

Referring to FIG. 8, the base 20, 30 may be fixed to the front surface of a wall mount WM through a fastening member such as a screws or nail. The hinge 50 may be fixed to the front surface of the wall mount WM by penetrating the base 20, 30 through a fastening member such as a screw or nail. Here, the wall mount WM may be installed on a wall, etc., and may include a metal material.

For example, the base hole 21 may be formed to penetrate the first base 20, and may penetrate the rear surface of the hinge 50. For another example, a fastening hole (not shown) may be formed in the first base 20, and a fastening member fastened to the hinge 50 and the wall mount WM may penetrate the fastening hole, and the rear surface of the hinge 50 may be in contact with the first base 20.

Accordingly, the hinge 50 may be directly coupled to the wall mount WM. In other words, compared to the case where the hinge 50 is directly coupled to the base 20, 30, the structural stability of the display device 1 can be improved.

Meanwhile, a first portion WM1 of the wall mount WM may contact a wall, etc. A second portion WM2 of the wall mount WM may protrude in a forward direction from the first portion WM1, and may contact the rear surface of the first base 20. In this case, the first base 20 may be fixed to the second portion WM2 through a fastening member, and the second base 30 may be spaced apart from the first portion WM1. Accordingly, air passing through a plurality of holes (no reference numeral) formed on the rear surface of the second base 30 may flow between the first portion WM1 and the second base 30.

Referring to FIG. 9, the hinge 50 may include a plate 51, a first holder 52, a second holder 53, a plurality of arms 54, 55, and 56, and a joint 57. The plurality of arms 54, 55, and 56 may be collectively referred to as a link or foldable link.

The plate 51 may form the rear surface of the hinge 50, and may be formed to be flat as a whole. The plate 51 may be fixed to the second portion WM2 of the wall mount WM by a fastening member. The plate 51 may include a first plate 51*a* and a second plate 51*b*. The first holder 52 and the second holder 53 may be fixed on the first plate 51*a* and the second plate 51*b*. Accordingly, the plurality of arms 54, 55, and 56 may be connected to the first holder 52 and the second holder 53 fixed on the first plate 51*a*, or may be connected to the first holder 52 and the second holder 53 fixed on the second plate 51*b*. For example, the first plate 51*a* and the second plate 51*b* may be formed as one body.

The first holder 52 may include a pair of first holders 52 spaced apart from each other in the up-down direction. A first pin 52*a* may penetrate the pair of first holders 52. The second holder 53 may be adjacent to the first holder 52. The second holder 53 may include a pair of second holders 53 spaced apart from each other in the up-down direction. A second pin 53*a* may penetrate the pair of second holders 53. The central axis of the second pin 53*a* may be disposed closer to the plate 51 than the central axis of the first pin 52*a*.

The plurality of arms 54, 55, and 56 may be disposed in a "y" shape as a whole. A first arm 54, a second arm 55, and a third arm 56 may intersect each other. One side of the first arm 54 may be located between a pair of second holders 53, and may be rotatably coupled to the second pin 53*a*. One side of the second arm 55 may be penetrated by a third pin 55*a*, and may be rotatably coupled to the third pin 55*a*. One side of the third arm 56, the other side of the first arm 54, and the other side of the second arm 55 may be penetrated by a fourth pin 56*a*, and may be rotatably coupled to the fourth pin 56*a*.

The joint 57 may be disposed between the first plate 51*a* and the second plate 51*b*. The plurality of arms 54, 55, and 56 may be adjacent to one surface adjacent to the first plate 51*a* of the joint 57, or may be adjacent to the other surface adjacent to the second plate 51*b* of the joint 57.

Referring to FIG. 10, a bar 60 may extend long. The bar 60 may include a vertical portion 61 and a horizontal portion 62. The vertical portion 61 may extend in a direction intersecting the longitudinal direction of the bar 60, and the horizontal portion 62 may extend in the longitudinal direction of the bar 60 from one end of the vertical portion 61. For example, the width of the horizontal portion 62 may be larger than the width of the vertical portion 61. For example, the bar 60 may include a metal material. Accordingly, the torsional rigidity and/or bending rigidity of the bar 60 may be improved.

An upper holder 611 may be adjacent to the upper end of the vertical portion 61. The upper holder 611 may protrude from the upper end of the vertical portion 61 in a direction that intersects the longitudinal direction of the vertical portion 61 and the longitudinal direction of the horizontal portion 62. The lower holder 612 may be adjacent to the lower end of the vertical portion 61. The lower holder 612 may protrude from the lower end of the vertical portion 61 in a direction that intersects the longitudinal direction of the vertical portion 61 and the longitudinal direction of the horizontal portion 62.

Referring to FIGS. 11 and 12, the first pin 52*a* may be inserted into the joint 57 by penetrating the pair of first holders 52, and the joint 57 may be rotatably coupled to the first pin 52*a*. The third pin 55*a* may penetrate one side of the second arm 55 and be inserted into the joint 57. The central axis of the third pin 55*a* may be disposed closer to the bar 60 than the central axis of the first pin 52*a*.

A fifth pin 56*b* may penetrate the upper holder 611 and the other side of the third arm 56, and the other side of the third arm 56 may be rotatably coupled to the fifth pin 56*b*. An upper pin 611*a* may be inserted into the joint 57 by penetrating the upper holder 611, and the upper holder 611 may be rotatably coupled to the upper pin 611*a*. The upper pin 611*a* may be disposed closer to the frame 12 than the fifth fin 56*b*. A lower pin 612*a* may be inserted into the joint 57 by penetrating the lower holder 612, and the lower holder 612 may be rotatably coupled to the lower pin 612*a*. The lower holder 612 may face the upper holder 611 with respect to the joint 57, and the lower pin 612*a* may be aligned with the upper pin 611*a* in the vertical direction. The upper pin 611*a* and the lower pin 612*a* may provide the center of rotation of the head 10 as a hinge axis of the hinge 50.

The hinge cover 58 may be located between the plate 51 and the bar 60, and cover at least a portion of the holder 52, 53, the plurality of arms 54, 55, and 56, and the joint 57. The first pin 52*a*, the upper pin 611*a*, and the lower pin 612*a* may penetrate the hinge cover 58.

Referring to FIGS. 13 and 14, the horizontal portion 62 of the bar 60 may face the rear surface of the frame 12, and may be located in the upper side of the back cover 13.

A plurality of first holes 62*a*, 62*b*, 62*c*, and 62*d* may be formed on the rear surface of the horizontal portion 62. A plurality of second holes 13*a*, 13*b*, 13*c*, and 13*d* may be formed on the rear surface of the back cover 13. The plurality of second holes 13*a*, 13*b*, 13*c*, and 13*d* may be a Video Electronics Standards Association (VESA) hole. The upper portion 71 of the bracket 70 may face the rear surface of the horizontal portion 62, and a plurality of third holes 71*a*, 71*b*, 71*c*, 71*d* may be formed in the upper portion 71 and aligned with the plurality of first holes 62*a*, 62*b*, 62*c*, 62*d*. The lower portion 72 of the bracket 70 may face the rear of the back cover 13, and the plurality of fourth holes 72*a*, 72*b*, 72*c*, and 72*d* may be aligned with the plurality of second holes 13*a*, 13*b*, 13*c*, 13*d*. A fastening member, such as a screw, may penetrate the plurality of third holes 71*a*, 71*b*, 71*c*, 71*d* to be fastened to the plurality of first holes 62*a*, 62*b*, 62*c*, 62*d*, and penetrate the plurality of fourth holes 72*a*, 72*b*, 72*c*, 72*d* to be fastened to the plurality of second holes 13*a*, 13*b*, 13*c*, 13*d*. Accordingly, the back cover 13 may be fixed to the bar 60 through the bracket 70.

A pin hole 711, 712 may be formed in the upper side of the bracket 70. The upper side of the bracket 70 may overlap the horizontal portion 62 in the up-down direction. A first pin hole 711 may be adjacent to one end of the upper side of the bracket 70, and a second pin hole 712 may be adjacent to the other end of the upper side of the bracket 70. An adjustment member AM1, AM2, such as a screw, may be fastened to the first pin hole 711 and the second pin hole 712, and may rotate on the horizontal portion 62. For example, if the fastening length of a first adjustment member AM1 with respect to the first pin hole 711 is greater than the fastening length of a second adjustment member AM2 with respect to the second pin hole 712, one end of the upper side of the bracket 70 may be located higher than the other end. For example, if the fastening length of the second adjustment member AM2 with respect to the second pin hole 712 is greater than the fastening length of the first adjustment member AM1 with respect to the first pin hole 711, the other end of the upper side of the bracket 70 may be located higher than one end.

Accordingly, a user may adjust the left and right horizontality of the head 10 fixed to the bracket 70 through the adjustment member AM1, AM2. For example, an auxiliary plate 63 may be fixed to the upper side of the horizontal portion 62 through a fastening hole 63*a*, 63*b*, and the adjustment member AM1, AM2 may rotate on the auxiliary plate 63. In this case, the auxiliary plate 63 may minimize damage to the horizontal portion 62 due to rotation of the adjustment member AM1, AM2. For example, the bar 60 may include an aluminum Al material, and the auxiliary plate 63 may include an iron Fe material. Meanwhile, if the bar 60 includes the iron Fe material, the auxiliary plate 63 may be omitted.

Referring to FIGS. 15 and 16, the head 10 may be disposed parallel to the base 20, 30. In this case, the angle (theta a) between the first arm 54 and the third arm 56 may be slightly smaller than 180 degrees. For example, the angle (theta a) may be greater than 175 degrees and smaller than 180 degrees. Accordingly, it may be necessary to apply an external force of a certain magnitude or more to rotate the third arm 56 with respect to the first arm 54. In other words, a force of a certain magnitude or more may be required to rotate the head 10 with respect to the upper pin 611*a*. For example, the head 10 may be disposed parallel to the case 2, 3 (see FIG. 3) located in the left or right of the base 20, 30.

The angle (theta b) between the first arm 54 and the second arm 55 may be an acute angle, and may be smaller than the angle (theta a) between the first arm 54 and the third arm 56. In addition, the head 10 may completely close the front of the base 20, 30.

Referring to FIGS. 17 and 18, the head 10 may be disposed inclined at a first angle (theta 1) with respect to the base 20, 30. For example, the first angle (theta 1) may be 30 degrees. In this case, the angle (theta c) between the first arm 54 and the third arm 56 may be greater than 180 degrees.

The joint 57 may rotate clockwise with respect to the first pin 52*a* and may be separated from the plate 51. The head 10 may rotate counterclockwise with respect to the upper pin 611*a*. Accordingly, the head 10 may be lifted in a direction away from the base 20, 30 and rotate in a direction for opening the front of the base 20, 30. In addition, the rotation of the head 10 may not be interfered with by one side of the base 20, 30 or the first case 2.

Referring to FIGS. 19 and 20, the head 10 may be disposed inclined at a second angle (theta 2) with respect to the base 20, 30. For example, the second angle (theta 2) may be 60 degrees. In this case, the angle (theta d) between the first arm 54 and the third arm 56 may be greater than 180 degrees.

The head 10 may rotate counterclockwise with respect to the upper pin 611*a*. Accordingly, the head 10 may rotate in a direction for further opening the front of the base 20, 30.

Referring to FIGS. 21 and 22, the head 10 may form a right angle (theta 3) with respect to the base 20, 30. In this case, the angle (theta e) between the first arm 54 and the third arm 56 may be greater than 180 degrees.

The head 10 may rotate counterclockwise with respect to the upper pin 611*a*. Accordingly, the head 10 may rotate in a direction to completely open the front of the base 20, 30.

In addition, one side of the head 10 may be located in the internal space of the base 20, 30. In other words, in a direction that is perpendicular to the head 10 and faces the hinge 50, the interior of the hinge 50 and the base 20, 30 may be obscured by the head 10.

Meanwhile, the head 10 may be disposed inclined at an obtuse angle with respect to the base 20, 30.

Referring to FIGS. 23 to 25, the third arm 56 may include a first part 561 and a second part 562. The first part 561 and the second part 562 may extend long in the same direction. The fourth pin 56*a* (see FIG. 11) may penetrate the hole 56*c* formed in the second part 562. The fifth pin 56*b* (see FIG. 11) may penetrate the hole 56*d* formed in the first part 561.

The first wing 561*a* may be formed in one side of the first part 561, and the second wing 561*b* may be formed in the other side of the first part 561. The third wing 562*a* may be formed in one side of the second part 562, and the fourth wing 562*b* may be formed in the other side of the second part 562. The first wing 561*a* and the third wing 562*a* may face each other, and may be coupled to each other by a fastening member S1, N1 such as a bolt, nut, or screw. The second wing 561*b* and the fourth wing 562*b* may face each other, and may be coupled to each other by a fastening member S2, N2 such as a bolt, nut, or screw.

Accordingly, the first part 561 and the second part 562 may be separably coupled to each other. In addition, the distance between the first part 561 and the second part 562 may be adjusted by adjusting the fastening length of the fastening member S1, N1, S2, N2. In other words, the first part 561 and the second part 562 may become closer to or move away from each other while being coupled to each other.

Referring to FIGS. 23 and 24, although the angle between the first arm 54 and the third arm 56 is formed as theta a, the head 10 may be inclined outwardly of the base 20, 30 with respect to the base 20, 30 (see FIG. 16), and the head 10 may not completely close the front of the base 20, 30. In this case, the distance between the hole 56*d* of the first part 561 and the hole 56*c* of the second part 562 may be adjusted from L1 to L2 which is larger than L1. Accordingly, when the angle between the first arm 54 and the third arm 56 is theta a, the head 10 may be disposed closer to the plate 51, and the head 10 may completely close the front of the base 20, 30 (see FIG. 16) while being disposed parallel to the base 20, 30.

Referring to FIGS. 23 and 25, although the angle between the first arm 54 and the third arm 56 is formed as theta a, the head 10 may be inclined inwardly of the base 20, 30 with respect to the base 20, 30 (see FIG. 16), and a part of the head 10 may be located inside the base 20, 30. In this case, the distance between the hole 56*d* of the first part 561 and the hole 56*c* of the second part 562 may be adjusted from L1 to L3 which is smaller than L1. Accordingly, when the angle between the first arm 54 and the third arm 56 is theta a, the head 10 may be disposed further away from the plate 51, and the head 10 may completely close the front of the base 20, 30 (see FIG. 16) while being disposed parallel to the base 20, 30.

Referring to FIGS. 26 and 27, an adjusting portion 613 may be a portion through which the fifth pin 56*b* of the upper holder 611 penetrates. The position of a portion through which the upper pin 611*a* of the upper holder 611 penetrates with respect to the adjusting portion 613 may be varied in the longitudinal direction of the third arm 56. The longitudinal direction of the third arm 56 may include a first direction toward the fourth pin 56*a* and a second direction toward the fifth pin 56*b*.

Referring to FIGS. 15 and 26, although the angle between the first arm 54 and the third arm 56 is formed as theta a, the head 10 may be inclined outwardly of the base 20, 30 with respect to the base 20, 30 (see FIG. 16), and the head 10 may not completely close the front of the base 20, 30. In this case, the position of a portion through which the upper pin 611*a* of the upper holder 611 penetrates with respect to the adjusting portion 613 may be adjusted in the first direction. Accordingly, when the angle between the first arm 54 and the third arm 56 is theta a, the head 10 may be disposed closer to the plate 51, and the head 10 may completely close the front of the base 20, 30 (see FIG. 16) while being disposed parallel to the base 20, 30.

Referring to FIGS. 15 and 27, although the angle between the first arm 54 and the third arm 56 is formed as theta a, the head 10 may be inclined inwardly of the base 20, 30 with respect to the base 20, 30 (see FIG. 16), and a part of the head 10 may be located inside the base 20, 30. In this case, the position of a portion through which the upper pin 611*a* of the upper holder 611 penetrates with respect to the adjusting portion 613 may be adjusted in the second direction. Accordingly, when the angle between the first arm 54 and the third arm 56 is theta a, the head 10 may be disposed further away from the plate 51, and the head 10 may completely close the front of the base 20, 30 (see FIG. 16) while being disposed parallel to the base 20, 30.

Referring to FIG. 28, the vertical portion 61 and the horizontal portion 62 of the bar 60 may be separably coupled to each other. The upper holder 611 and the lower holder 612 may be formed in one side of the vertical portion 61, and the horizontal portion 62 may be separably formed in the other side of the vertical portion 61 opposite to the one side of the vertical portion 61. The vertical portion 61 and the horizontal portion 62 may have a thickness sufficient to overcome the load applied to the bar 60.

A groove 62*g* may be formed in one side and/or the other side of the horizontal portion 62, and may extend in the longitudinal direction of the horizontal portion 62. Accordingly, the rigidity of the bar 60 may be improved.

Meanwhile, a fastening member (not shown) such as an anchor bolt may penetrate the plate 51 and be fastened to the wall mount WM (see FIG. 8), and the fastening member may be adjacent to the circumference of the plate 51.

Referring to FIG. 29, the horizontal portion 62 may include an extension portion 621 and a fastening portion 622. The extension portion 621 may define most of the horizontal portion 62, and the fastening portion 622 may be formed at the distal end of the extension portion 621. For example, the fastening portion 622 may be formed by pressing from one side of the extension portion 621 to the other side (see d10 in FIG. 29).

For example, the horizontal portion 62 may have a solid square lumber shape as a whole. For another example, the horizontal portion 62 may have a hollow square lumber shape as a whole. At this time, a part of the vertical portion 61 or a member fixed to the vertical portion 61 may be press-fitted into the horizontal portion 62, so that the horizontal portion 62 may be detachably coupled to the vertical portion 61.

A fastening hole 62*h* may be formed by penetrating the fastening portion 622 in the thickness direction of the fastening portion 622. For example, the plurality of fastening holes 62*h* may be spaced apart from each other in the longitudinal and width direction of the fastening portion 622.

Referring to FIGS. 30 and 31, the upper holder 611 and the lower holder 612 may protrude outward (rearward) from one surface (rear surface) of the vertical portion 61. As described above, the upper holder 611 may be rotatably coupled to the third arm 56.

A first seating groove 61*a* and a second seating groove 61*b* may be formed in the other surface (front surface) of the vertical portion 61 which is opposite to the one surface of the vertical portion 61. Each of the first seating groove 61*a* and the second seating groove 61*b* may have a shape corresponding to the fastening portion 622.

In the width direction of the vertical portion 61, the upper holder 611 and the lower holder 612 may be located in one side (left side) of the vertical portion 61, and the first seating groove 61*a* and the second seating groove 61*b* may be located in the other side (right side). In the longitudinal direction of the vertical portion 61, the upper holder 611 and the first seating groove 61*a* may be located in one end (upper end) of the vertical portion 61, and the lower holder 612 and the second seating groove 61*b* may be located in the other end (lower end) of the vertical portion 61.

A first hole 61*h*1 may be formed by penetrating the first seating groove 61*a* in the thickness direction of the vertical portion 61. For example, the plurality of first holes 61*h*1 may be spaced apart from each other in the longitudinal and width direction of the vertical portion 61.

A second hole 61*h*2 may be formed by penetrating the second seating groove 61*b* in the thickness direction of the vertical portion 61. For example, the plurality of second holes 61*h*2 may be spaced apart from each other in the longitudinal and width direction of the vertical portion 61.

The fastening portion 622 may be seated on the first seating groove 61*a*. The fastening hole 62*h* of the fastening portion 622 may be aligned with the first hole 61*h*1. A fastening member such as a screw may penetrate the fastening hole 62*h* and be fastened to the first hole 61*h*1. Accordingly, the horizontal portion 62 may be detachably coupled to the vertical portion 61.

A cover plate 60P may have a shape corresponding to each of the first seating groove 61*a* and the second seating groove 61*b*. The cover plate 60P may be seated on the second seating groove 61*b*. A fastening hole 60Ph may be formed by penetrating the cover plate 60P in the thickness direction of the cover plate 60P, and may be aligned with the second hole 61*h*2. A fastening member such as a screw may penetrate the fastening hole 60Ph and be fastened to the second hole 61*h*2. Accordingly, the cover plate 60P may be detachably coupled to the vertical portion 61 and cover the second seating groove 61*b*.

Referring to FIGS. 32 and 33, the upper holder 611 and the lower holder 612 may protrude outward (rearward) from one surface (rear surface) of the vertical portion 61. As described above, the upper holder 611 may be rotatably coupled to the third arm 56.

The first seating groove 61*a* and the second seating groove 61*b* may be formed on the other surface (front surface) of the vertical portion 61 opposite to the one surface of the vertical portion 61. Each of the first seating groove 61*a* and the second seating groove 61*b* may have a shape corresponding to the fastening portion 622.

In the width direction of the vertical portion 61, the upper holder 611 and the lower holder 612 may be located in one side (right side) of the vertical portion 61, and the first seating groove 61*a* and the second seating groove 61*b* may be located on the other side (left side). In the longitudinal direction of the vertical portion 61, the upper holder 611 and the first seating groove 61*a* may be located in one end (lower end) of the vertical portion 61, and the lower holder 612 and the second seating groove 61*b* may be located in the other end (upper end) of the vertical portion 61.

The first hole 61*h*1 may be formed by penetrating the first seating groove 61*a* in the thickness direction of the vertical portion 61. For example, the plurality of first holes 61*h*1 may be spaced apart from each other in the longitudinal and width direction of the vertical portion 61.

The second hole 61*h*2 may be formed by penetrating the second seating groove 61*b* in the thickness direction of the vertical portion 61. For example, the plurality of second holes 61*h*2 may be spaced apart from each other in the longitudinal and width direction of the vertical portion 61.

The fastening portion 622 may be seated on the second seating groove 61*b*. The fastening hole 62*h* of the fastening portion 622 may be aligned with the second hole 61*h*2. A fastening member such as a screw may penetrate the fastening hole 62*h* and be fastened to the second hole 61*h*2. Accordingly, the horizontal portion 62 may be detachably coupled to the vertical portion 61.

The cover plate 60P may have a shape corresponding to each of the first seating groove 61*a* and the second seating groove 61*b*. The cover plate 60P may be seated on the first seating groove 61*a*. The fastening hole 60Ph may be formed by penetrating the cover plate 60P in the thickness direction of the cover plate 60P, and may be aligned with the first hole 61*h*1. A fastening member such as a screw may penetrate the fastening hole 60Ph and be fastened to the first hole 61*h*1. Accordingly, the cover plate 60P may be detachably coupled to the vertical portion 61, and may cover the first seating groove 61*a*.

Referring again to FIGS. 7 and 31, the hinge 50 may be adjacent to the left side of the head 10 and the left side of the base 20, 30. The head 10 may rotate counterclockwise with respect to the upper pin 611*a*, that is, in a direction that opens the front of the base 20, 30. The head 10 may rotate clockwise with respect to the upper pin 611*a*, that is, in a direction that closes the front of the base 20, 30.

Referring again to FIGS. 7 and 33, the hinge 50 may be adjacent to the right side of the head 10 and the right side of the base 20, 30. The head 10 may rotate clockwise with respect to the upper pin 611*a*, that is, in a direction that opens the front of the base 20, 30. The head 10 may rotate counterclockwise with respect to the upper pin 611*a*, that is, in a direction that closes the front of the base 20, 30.

To this end, the hinge 50 and the vertical portion 61 shown in FIGS. 7 and 31 may rotate counterclockwise by 180 degrees based on the front-rear direction. At this time, the horizontal portion 62 may be separated from the first seating groove 61*a* and coupled to the second seating groove 61*b*. In addition, the head 10 may be located in front of the horizontal portion 62, and may be fixed to the horizontal portion 62 through the bracket 70.

Accordingly, the head 10 may rotate around a hinge axis adjacent to the left side of the base 20, 30, or may rotate around a hinge axis adjacent to the right side of the base 20, 30. In other words, the hinge 50 and its related structure are interchangeable in the left-right direction.

Referring to FIGS. 34 and 35, the vertical portion 61 and the horizontal portion 62 of the bar 60 may be separably coupled to each other. The upper holder 611 and the lower holder 612 may protrude outward (rearward) from one surface (rear surface) of the vertical portion 61. As described above, the upper holder 611 may be rotatably coupled to the third arm 56 (see FIG. 12).

The fastening hole 620*h* may be formed by penetrating the horizontal portion 62 in the thickness direction of the horizontal portion 62. The fastening hole 620*h* may be adjacent to the boundary between the horizontal portion 62 and the vertical portion 61. For example, the plurality of fastening holes 620*h* may be spaced apart from each other in the width direction of the horizontal portion 62.

The first hole 61*h*3 may be formed by penetrating the vertical portion 61 in the thickness direction of the vertical portion 61. The first hole 61*h*3 may be adjacent to the boundary between the vertical portion 61 and the horizontal portion 62. For example, the plurality of first holes 61*h*3 may be spaced apart from each other in the longitudinal direction of the vertical portion 61.

The second hole 61*h*4 may be formed by penetrating the vertical portion 61 in the thickness direction of the vertical portion 61. The second hole 61*h*4 may be spaced apart from the first hole 61*h*3 in the longitudinal direction of the vertical portion 61. For example, the plurality of second holes 61*h*4 may be spaced apart from each other in the longitudinal direction of the vertical portion 61.

Referring to FIG. 34, the upper holder 611 may be adjacent to the upper end of the vertical portion 61, and the horizontal portion 62 may face the upper holder 611 with respect to the vertical portion 61. A coupling plate 60F may cover at least a portion of the boundary between the vertical portion 61 and the horizontal portion 62, and may be disposed inside and/or outside the bar 60. For example, the plurality of coupling plates 60F may be spaced apart from each other along the boundary between the vertical portion 61 and the horizontal portion 62. A fastening member such as a screw may penetrate the coupling plate 60F and be fastened to the fastening hole 620*h* and the first hole 61*h*3. Accordingly, the horizontal portion 62 may be detachably coupled to the vertical portion 61.

The supporter 61 may protrude from one side of the vertical portion 61 that defines the boundary between the vertical portion 61 and the horizontal portion 62, and may support the horizontal portion 62. Accordingly, the bending rigidity of the bar 60 can be improved. Referring to FIG. 35, the lower holder 612 may be adjacent to the upper end of the vertical portion 61, and the horizontal portion 62 may face the lower holder 612 with respect to the vertical portion 61.

The coupling plate 60F may cover at least a portion of the boundary between the vertical portion 61 and the horizontal portion 62, and may be disposed inside and/or outside the bar 60. For example, the plurality of coupling plates 60F may be spaced apart from each other along the boundary between the vertical portion 61 and the horizontal portion 62. A fastening member such as a screw may penetrate the coupling plate 60F and be fastened to the fastening hole 620*h* and the second hole 61*h*4. Accordingly, the horizontal portion 62 may be detachably coupled to the vertical portion 61.

The supporter 61 may protrude from one side of the vertical portion 61 that defines the boundary between the vertical portion 61 and the horizontal portion 62, and may support the horizontal portion 62. Accordingly, the bending rigidity of the bar 60 can be improved.

Referring again to FIGS. 7 and 34, the hinge 50 may be adjacent to the left side of the head 10 and the left side of the base 20, 30. The head 10 may rotate counterclockwise with respect to the hinge axis, that is, in a direction that opens the front of the base 20, 30. The head 10 may rotate clockwise with respect to the hinge axis, that is, in a direction that closes the front of the base 20, 30.

Referring again to FIGS. 7 and 35, the hinge 50 may be adjacent to the right side of the head 10 and the right side of the base 20, 30. The head 10 may rotate clockwise with respect to the hinge axis, that is, in a direction that opens the front of the base 20, 30. The head 10 may rotate counterclockwise with respect to the hinge axis, that is, in a direction that closes the front of the base 20, 30.

To this end, the hinge 50 and the vertical portion 61 shown in FIGS. 7 and 34 may rotate counterclockwise by 180 degrees based on the front-rear direction. At this time, the horizontal portion 62 may be separated from the first hole 61*h*3 and coupled to the second hole 61*h*4. In addition, the head 10 may be located in front of the horizontal portion 62, and may be fixed to the horizontal portion 62 through the bracket 70.

Accordingly, the head 10 may rotate around a hinge axis adjacent to the left side of the base 20, 30, or may rotate around a hinge axis adjacent to the right side of the base 20, 30. In other words, the hinge 50 and its related structure are interchangeable in the left-right direction.

Referring to FIGS. 1 to 35, a display device according to an aspect of the present disclosure may include: a head including a display panel; base positioned behind the head and having an opening formed in a front surface; and a hinge coupled to the head adjacent to one side of the head and including a hinge axis parallel to the one side of the head, wherein the head may be rotatable about the hinge axis, and wherein the base may include a partition wall dividing an internal space of the base into at least two spaces.

In addition, according to another aspect of the present disclosure, the partition wall may extend in a left-right direction, wherein the base may include: a first base located below the partition wall; and a second base located above the partition wall, wherein the head may open or close an inner space of the first base and an inner space of the second base.

In addition, according to another aspect of the present disclosure, the head may include: a frame coupled to a rear surface of the display panel; and a back cover coupled to a rear surface of the frame, wherein the back cover may be disposed in the internal space of the first base.

In addition, according to another aspect of the present disclosure, the second base may further include: a plurality of holes formed to penetrate a rear surface of the second base; a plurality of racks fixed to the plurality of holes; and a multi-tap installed inside the second base, and the display device may further include a cover which intersects the partition wall and is detachably coupled to a front end of the partition wall.

In addition, according to another aspect of the present disclosure, the display device may further include a case which is detachably coupled to one side of the base and which includes a speaker unit or a storage.

In addition, according to another aspect of the present disclosure, the hinge may be located between the first base and the head.

In addition, according to another aspect of the present disclosure, the display device may further include a wall mount which is located in a rear of the first base, and to which the first base is fixed, wherein the hinge may be directly coupled to the wall mount.

In addition, according to another aspect of the present disclosure, the display device may further include a bar which extends and which is coupled to a rear surface of the head, the bar may include: a vertical portion extending in a direction intersecting a longitudinal direction of the bar; and a horizontal portion extending from one end of the vertical portion in the longitudinal direction of the bar, and the vertical portion may be rotatable about the hinge axis.

In addition, according to another aspect of the present disclosure, the vertical portion may further include: an upper holder adjacent to an upper end of the vertical portion; and a lower holder adjacent to a lower end of the vertical portion, and the hinge axis may include: an upper pin penetrating the upper holder; and a lower pin penetrating the lower holder.

In addition, according to another aspect of the present disclosure, the hinge may include: a plate; a holder fixed on the plate; a joint which is located between the upper holder and the lower holder and which is rotatably coupled to the upper pin and the lower pin, the joint rotatably coupled to the holder; and a foldable link connected to the holder and the upper holder.

In addition, according to another aspect of the present disclosure, the holder may further include: a first holder through which a first pin inserted into the joint penetrates; and a second holder through which a second pin having a central axis disposed closer to the plate than a central axis of the first pin penetrates, and the foldable link may further include: a first arm having one side which is rotatably coupled to the second pin; a second arm which intersects the first arm, and which is rotatably coupled to a third pin having one side which has a central axis disposed closer to the bar than the central axis of the first pin; and a third arm which intersects the second arm, and which has one side which is rotatably coupled to a fourth pin penetrating the other side of the first arm and the other side of the second arm, wherein the other side of the third arm may be rotatably coupled to a fifth pin which penetrates the upper holder and which has a central axis disposed farther from the vertical portion than the upper pin.

In addition, according to another aspect of the present disclosure, an angle between the first arm and the third arm may be greater than 175 degrees and less than 180 degrees, when the head is disposed parallel to the base.

In addition, according to another aspect of the present disclosure, the third arm may further include: a first part; and a second part detachably coupled to the first part in a longitudinal direction of the third arm, wherein a gap between the first part and the second part may be adjustable.

In addition, according to another aspect of the present disclosure, the upper holder may include an adjusting portion which is a portion through which the fifth pin of the upper holder penetrates, wherein a position of a portion through which the upper pin of the upper holder penetrates may be variable with respect to the adjusting portion in a longitudinal direction of the third arm.

In addition, according to another aspect of the present disclosure, the head may include: a frame which is coupled to a rear surface of the display panel and which faces the horizontal portion; and a back cover which is coupled to a portion of a rear surface of the frame, and the display device may further include: a bracket which is coupled to the back cover and the horizontal portion, and which has an upper side which overlaps the horizontal portion in an up-down direction; and an auxiliary plate which is disposed between the bracket and the horizontal portion, wherein the brackets may include: a first pin hole adjacent to one end of the upper side of the bracket; a first pin hole through which the first adjustment member rotating on the auxiliary plate passes; and a second pin hole which is adjacent to the other end of the upper side of the bracket, the second pin hole through which a second adjustment member rotating on the auxiliary plate penetrates.

In addition, according to another aspect of the present disclosure, the vertical portion may include a first portion and a second portion that are spaced apart from each other in the longitudinal direction of the vertical portion, and the horizontal portion may be detachably coupled to the first portion or the second portion.

In addition, according to another aspect of the present disclosure, the bar may further include a supporter protruding from one side of the vertical portion defining a boundary between the vertical portion and the horizontal portion, and the supporter may be located between the first portion and the second portion, and may support the horizontal portion.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:

a head including a display panel;

a base positioned behind the head and having an opening formed in a front surface;

a hinge assembly coupled to the head adjacent to one side of the head and defining a hinge axis parallel to the one side of the head, wherein the head is rotatable relative to the base about the hinge axis between a closed state and an open state;

a bar coupled to a rear surface of the head, the bar comprising:

a vertical portion extending in a direction intersecting a longitudinal direction of the bar; and a horizontal portion extending from one end of the vertical portion in the longitudinal direction of the bar;

wherein the vertical portion is rotatable about the hinge axis through an upper pin and a lower pin penetrating the vertical portion;

wherein the hinge assembly further comprises a foldable link including at least a first arm and a third arm rotatably connected to the vertical portion;

wherein, when the head is disposed parallel to the base in the closed state, an angle between the first arm and the third arm is greater than 175 degrees and less than 180 degrees such that rotation of the head about the hinge axis is mechanically resisted; and wherein rotation of the head from the closed state toward the open state is initiated only when an external force exceeding a predetermined threshold is applied to the head.

2. The display device of claim 1, wherein the base comprises a partition wall dividing an internal space of the base into at least a first base and a second base located above the first base, and wherein the head opens or closes inner spaces of the first base and the second base.

3. The display device of claim 1, wherein, during rotation of the head from the closed state toward the open state, the head is lifted away from the base prior to rotation, thereby preventing interference between the head and the base.

4. The display device of claim 1, wherein the vertical portion further comprises:

an upper holder adjacent to an upper end of the vertical portion; and a lower holder adjacent to a lower end of the vertical portion, wherein the hinge axis comprises:

an upper pin penetrating the upper holder; and a lower pin penetrating the lower holder.

5. The display device of claim 1, further comprising a bracket coupling the horizontal portion of the bar to a back cover of the head and an auxiliary plate disposed between the bracket and the horizontal portion, wherein an adjustment member is configured to adjust a left right level of the head.

6. The display device of claim 4, wherein the hinge comprises:

a plate;

a holder fixed on the plate;

a joint rotatably coupled to the upper pin and the lower pin, and a foldable link connected to the holder and the upper holder.

7. The display device of claim 6, wherein the holder comprises:

a first holder through which a first pin penetrates; and a second holder through which a second pin penetrates, and wherein the foldable link comprises:

a first arm, a second arm, and a third arm intersecting each other and rotatably coupled by a plurality of pins having different axial positions.

8. The display device of claim 7, wherein an angle between the first arm and the third arm is greater than 175 degrees and less than 180 degrees, when the head is disposed parallel to the base.

9. The display device of claim 7, wherein the third arm comprises:

a first part; and a second part detachably coupled to each other in a longitudinal direction, and wherein a gap between the first part and the second part is adjustable.

10. The display device of claim 7, wherein the upper holder comprises an adjusting portion which a pin penetrates, and wherein a position of the upper pin is variable with respect to the adjusting portion.

11. A display device comprising:

a head including a display panel;

a base positioned behind the head and having an opening formed in a front surface;

a hinge coupled to the head adjacent to one side of the head such that the head is rotatable relative to the base;

wherein the base includes a partition wall extending in a left right direction and dividing an internal space of the base into a first base and a second base located above the first base;

wherein the second base comprises:

a plurality of holes formed to penetrate a rear surface of the second base;

a plurality of racks fixed to the plurality of holes; and a multi tap installed inside the second base; and wherein the display device further comprises a cover intersecting the partition wall and detachably coupled to a front end of the partition wall.

12. The display device of claim 11, wherein the head opens or closes inner spaces of the first base and the second base.

13. The display device of claim 11, wherein the head comprises a frame coupled to a rear surface of the display panel and a back cover coupled to the frame, and wherein the back cover is disposed within the first base when the head is in a closed state.

14. A display device comprising:

a head including a display panel;

a base positioned behind the head and having an opening formed in a front surface;

a wall mount located behind the base and fixed to a mounting surface;

a hinge assembly disposed between the head and the wall mount, wherein the hinge assembly is directly coupled to the wall mount through the base;

wherein the base is fixed to the wall mount independently of the hinge assembly; and wherein the head is rotatable relative to the base about a hinge axis defined by the hinge assembly.

15. The display device of claim 14, wherein the hinge assembly comprises a plate fixed to the wall mount and a joint rotatably supported on the plate, and wherein the hinge axis is defined by pins penetrating the joint.

* * * * *